(12) United States Patent
Ushinaga et al.

(10) Patent No.: US 11,477,405 B2
(45) Date of Patent: Oct. 18, 2022

(54) SOLID-STATE IMAGE SENSOR

(71) Applicant: SHARP KABUSHIKI KAISHA, Sakai (JP)

(72) Inventors: Takeo Ushinaga, Sakai (JP); Yoshinao Morikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/193,434

(22) Filed: Mar. 5, 2021

(65) Prior Publication Data

US 2021/0314518 A1 Oct. 7, 2021

Related U.S. Application Data

(60) Provisional application No. 63/003,558, filed on Apr. 1, 2020.

(51) Int. Cl.
*H04N 5/3745* (2011.01)
*H04N 5/378* (2011.01)
*H03M 1/08* (2006.01)
*H03M 1/56* (2006.01)

(52) U.S. Cl.
CPC ...... *H04N 5/37455* (2013.01); *H03M 1/0872* (2013.01); *H03M 1/56* (2013.01); *H04N 5/378* (2013.01)

(58) Field of Classification Search
CPC .. H04N 5/37455; H04N 5/378; H04N 5/3575; H03M 1/0872; H03M 1/56; H03M 1/123; H03M 1/1295
See application file for complete search history.

(56) References Cited

U.S. PATENT DOCUMENTS

| | | | | |
|---|---|---|---|---|
| 7,715,661 B2 * | 5/2010 | Yasui | ...................... | H04N 5/378 382/312 |
| 8,031,241 B2 * | 10/2011 | Maeda | ................. | H04N 5/3598 348/241 |
| 8,314,868 B2 * | 11/2012 | Yamamoto | ............. | H04N 5/374 327/100 |
| 2009/0009635 A1 * | 1/2009 | Maeda | ................... | H04N 5/378 348/241 |
| 2013/0015329 A1 | 1/2013 | Iwaki | | |
| 2015/0249797 A1 | 9/2015 | Yui et al. | | |
| 2019/0082134 A1 | 3/2019 | Ushinaga | | |

FOREIGN PATENT DOCUMENTS

| | | | | |
|---|---|---|---|---|
| JP | 2000-287131 | A | | 10/2000 |
| JP | 5728826 | B2 | | 6/2015 |
| JP | 2019-054399 | A | | 4/2019 |
| JP | 2020-028117 | A | | 2/2020 |
| JP | 2020-028124 | A | | 2/2020 |
| JP | 2020028117 | A | * 2/2020 | ............. H04N 5/359 |
| WO | 2014/065223 | A1 | | 5/2014 |

\* cited by examiner

*Primary Examiner* — Nhan T Tran
(74) *Attorney, Agent, or Firm* — ScienBiziP, P.C.

(57) ABSTRACT

An AD conversion circuit provided in a solid-state image sensor includes a counter circuit that performs count processing and a first latch circuit that holds at least one of a discrimination result of a first comparison circuit and a first output result of the counter circuit.

5 Claims, 18 Drawing Sheets

SOLID-STATE IMAGE SENSOR

BACKGROUND

1. Field

The present disclosure relates to a solid-state image sensor such as a complementary metal oxide semiconductor (CMOS) image sensor.

2. Description of the Related Art

A CMOS image sensor in the related art has a floating diffusion layer and an amplifier for each unit pixel arranged in a matrix. As the CMOS image sensor in the related art, a column-parallel output type image sensor in which unit pixels for one row constituting a pixel array are sequentially selected, and analog signals generated in each row of the selected unit pixels are simultaneously read out in a column direction has been mainly used. The analog signals read in the column direction are converted into digital signals by an analog-digital (AD) conversion circuit for each column.

As for the AD conversion circuit mounted on the column-parallel output type CMOS image sensor, various configurations have been proposed in the related art. Among them, an AD conversion circuit having a configuration in which low noise characteristics are realized by performing AD conversion on data in an initial state and data after signal accumulation and subtracting each data after the AD conversion has been mainly used.

The subtraction processing specifically refers to digital correlated double sampling (CDS). The digital CDS (hereinafter, referred to as digital CDS processing) is a method of canceling the variation for each unit pixel by determining a difference between a digital value obtained by performing AD conversion on a pixel signal line potential in a reset state of the pixel and a digital value obtained by performing AD conversion on a pixel signal line potential in a signal state, canceling the variation of the AD conversion circuit mounted on the column parallel output type CMOS image sensor for each column, and extracting only the data corresponding to the light incident on the unit pixel. Hereinafter, a method of subtraction processing by digital CDS processing is referred to as a digital CDS drive method. The reset state is a state in which the unit pixel is initialized, and the signal state is a state in which light is incident on the unit pixel.

However, in a case where intense light such as sunlight is incident on each unit pixel, an element separation state between the unit pixels is not maintained, and as a result, the reset state becomes abnormal. If the reset state becomes abnormal, the difference between the reset state and the signal state will not be correct. Therefore, if the intense light such as sunlight is incident on the unit pixel, the image is supposed to be output in white, but an erroneous output that an image is output in black occurs (hereinafter, a blackening phenomenon of an image).

In order to suppress a blackening phenomenon of the image as described above, for example, Japanese Unexamined Patent Application Publication No. 2000-287131 discloses a solid-state image sensor that detects a reset voltage during no-signal period to determine whether or not the intense light is incident on the unit pixel, and performs a predetermined processing only when the intense light is incident. Specifically, the solid-state image sensor of Japanese Unexamined Patent Application Publication No. 2000-287131 replaces the reset voltage with a no-signal voltage only when intense light is incident. Alternatively, the solid-state image sensor of Japanese Unexamined Patent Application Publication No. 2000-287131 clips the voltage before the voltage drops and uses it as a reset voltage. By executing any of these processing, the solid-state image sensor of Japanese Unexamined Patent Application Publication No. 2000-287131 is trying to suppress the blackening phenomenon of the image. Further, Japanese Unexamined Patent Application Publication No. 2019-54399 discloses a solid-state image sensor that realizes a reduction in a circuit scale and a reduction in power consumption while suppressing the blackening phenomenon of the image by performing AD conversion by the digital CDS drive method using a counter that operates at a negative initial value without using a bit for coding.

SUMMARY

However, the solid-state image sensor of Japanese Unexamined Patent Application Publication No. 2000-287131 needs to be provided with a pulse synthesizer, a selector, a voltage generator, and the like on a latter part of a comparator, which causes a problem in that a circuit scale becomes large. Further, although the technique disclosed in Japanese Unexamined Patent Application Publication No. 2019-54399 is effective for realizing the suppression of the blackening phenomenon of an image in the solid-state image sensor of the digital CDS drive method, it cannot be said it is not always effective in a solid-state image sensor of a hybrid CDS drive method. Here, the hybrid CDS drive method is a drive method of an AD conversion circuit in which analog CDS processing and digital CDS processing are combined.

Specifically, in the analog CDS processing in the hybrid CDS drive method, variation is cancelled for each unit pixel by determining the difference between the pixel signal line potential in the reset state and the pixel signal line potential in the signal state in the unit pixel in an analog manner. Further, in the digital CDS processing in hybrid CDS drive method, the variation for each column of the AD conversion circuit mounted on the column parallel output type CMOS image sensor is cancelled by determining the difference between a digital value obtained by performing AD conversion on a certain reference potential and a digital value obtained by performing AD conversion on the potential of the difference signal component after analog CDS processing of the pixel signal line. The hybrid CDS drive method is a method of extracting only the data corresponding to the light incident on the unit pixel by each of the above-mentioned processing.

It is desirable to realize a solid-state image sensor that can suppress a blackening phenomenon of an image in both a digital CDS drive method and a hybrid CDS drive method while reducing a circuit scale.

(1) According to an aspect of the present disclosure, there is provided a solid-state image sensor including a pixel unit in which a plurality of unit pixels for photoelectric conversion of incident light are arranged; an AD conversion circuit that performs AD conversion on a potential of an analog signal read from a pixel signal line connected to the plurality of the unit pixels; and a discrimination circuit that discriminates whether or not a reset potential at the potential of the analog signal is equal to or higher than a predetermined first reference potential, in which the AD conversion circuit includes a counter circuit that performs count processing and a first latch circuit that holds at least a discrimination result of the discrimination circuit among the discrimination result of the discrimination circuit and a first output result output from the counter circuit.

An aspect of the present disclosure has an effect that a blackening phenomenon of an image can be suppressed in both a digital CDS drive method and a hybrid CDS drive method while reducing a circuit scale.

DESCRIPTION OF THE EMBODIMENTS

A mode for carrying out the present disclosure will be described below. For convenience of explanation, members having the same functions as those described above are denoted by the same reference symbols, and the description may not be repeated.

First Embodiment

Configuration of Solid-State Image Sensor 1

Figure 1:
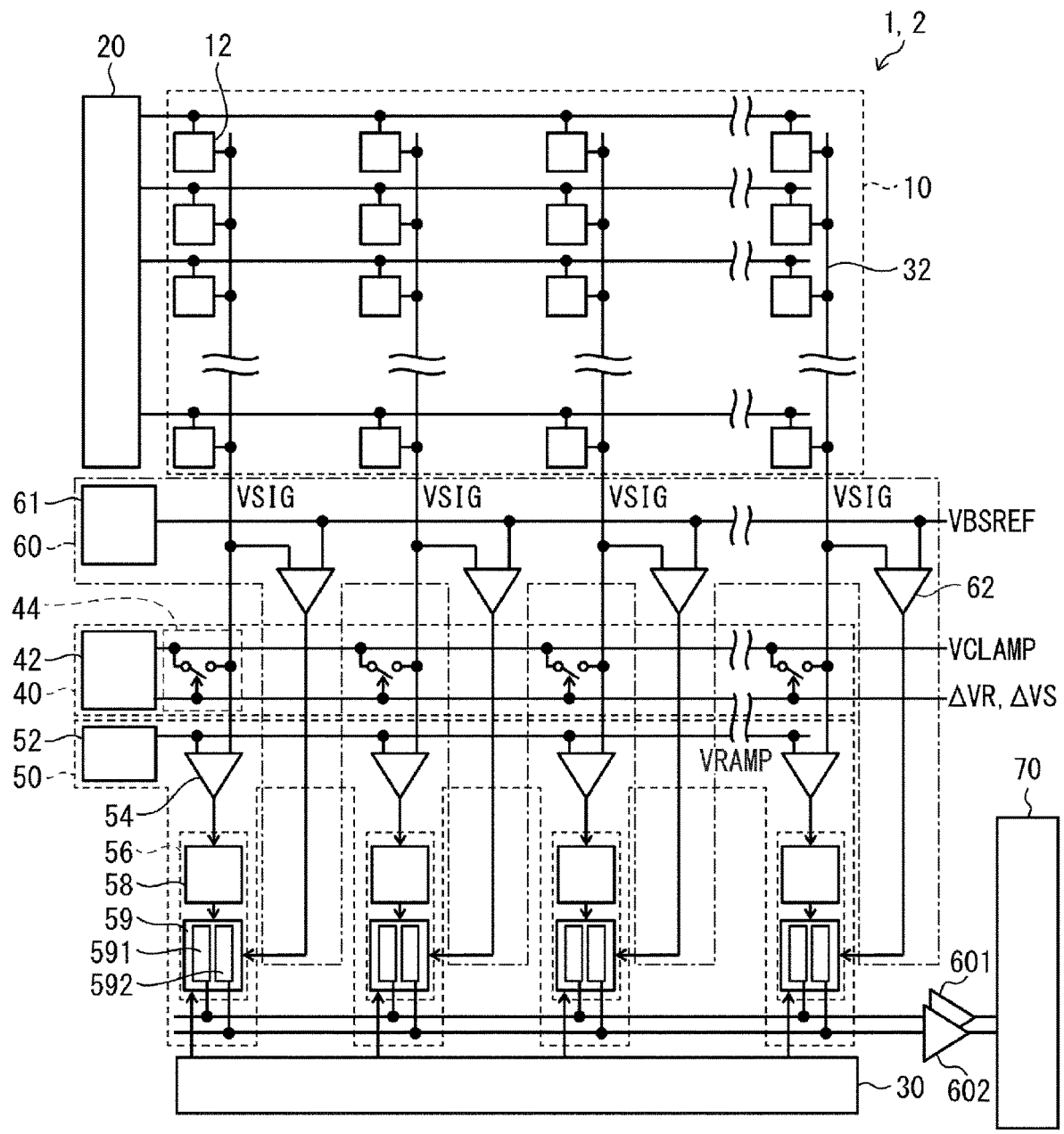
FIG. 1 is a circuit diagram illustrating a configuration example of a solid-state image sensor according to first and second embodiments of the present disclosure.

The configuration of the solid-state image sensor 1 according to the first embodiment of the present disclosure will be described with reference to FIGS. 1 to 4. As illustrated in FIG. 1, the solid-state image sensor 1 includes a pixel unit 10, a vertical scanning circuit 20, a horizontal scanning circuit 30, a clamping unit 40, an AD conversion circuit 50, a blackening phenomenon determination circuit 60, and a post-stage processing logic circuit 70. The blackening phenomenon determination circuit 60 is provided for each pixel column of a unit pixel 12.

Pixel Unit 10 and Vertical Scanning Circuit 20

The pixel unit 10 has a configuration in which a plurality of unit pixels 12 are arranged in a matrix. The unit pixel 12 photoelectrically converts the incident light into an analog signal. The unit pixels 12 arranged in the same pixel row direction are connected to the vertical scanning circuit 20 via same wiring 22, and are controlled by the vertical scanning circuit 20. Further, the unit pixels 12 arranged in the same pixel column direction are connected to a same pixel signal line 32. The analog signal output from the unit pixel 12 is transferred to the AD conversion circuit 50 through the pixel signal line 32.

The unit pixel 12 may have a general configuration such as a 3-transistor configuration, a 4-transistor configuration, or a global shutter pixel configuration. In the present embodiment, the 4-transistor configuration illustrated in FIG. 2 will be described as an example of configurations in which the unit pixel 12 can be obtained. The unit pixel 12 in FIG. 2 is a unit pixel of a CMOS image sensor formed of four transistors.

Figure 2:
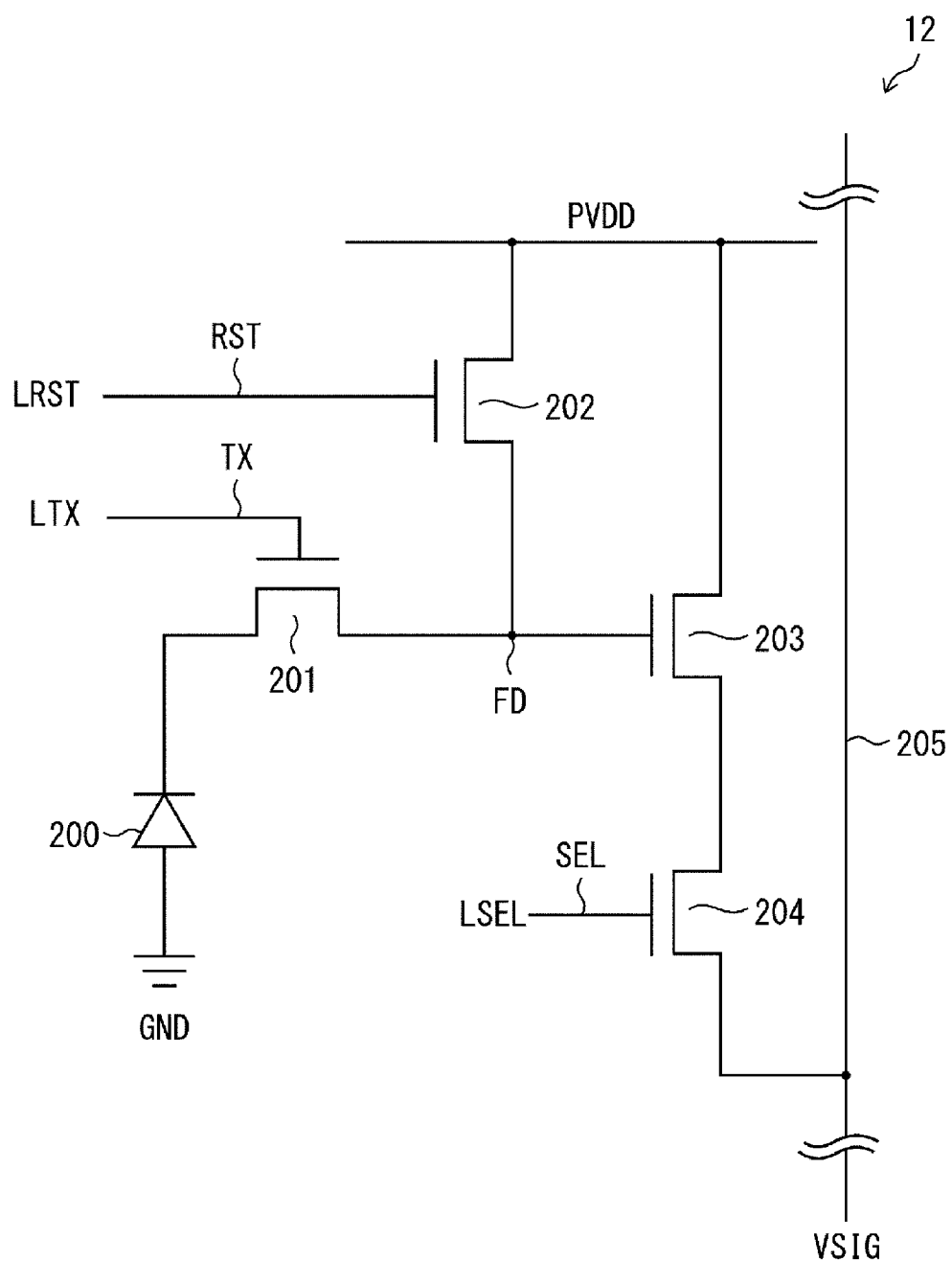
FIG. 2 is a diagram illustrating a general 4-transistor configuration (selectable type) as an example of a unit pixel configuration.

The unit pixel 12 in FIG. 2 has, for example, a photodiode 200 as a photoelectric conversion element. The unit pixel 12 of FIG. 2 includes a transfer transistor 201 as a transfer element, a reset transistor 202 as a reset element, and an amplification transistor 203 and a selection transistor 204 as active elements for one photodiode 200.

The photodiode 200 photoelectrically converts the incident light into electric charge (electrons in this case) having an amount corresponding to the amount of the light. The transfer transistor 201 is connected between the photodiode 200 and a floating diffusion FD as an output node. The transfer transistor 201 transfers the electrons photoelectrically converted by the photodiode 200 to the floating diffusion FD by receiving a drive signal TX to the gate (transfer gate) through a transfer control line LTX.

The reset transistor 202 is connected between a power supply line PVDD and the floating diffusion FD. The reset transistor 202 resets the potential of the floating diffusion FD to the potential of the power supply line PVDD by receiving a reset RST to the gate through a reset control line LRST.

The gate of the amplification transistor 203 is connected to the floating diffusion FD. The amplification transistor 203 is connected to a pixel signal line 205 via the selection transistor 204, and constitutes a source follower with a constant current source outside the pixel unit 10. Then, a control signal (address signal or select signal) SEL is given to the gate of the selection transistor 204 through a selection control line LSEL, and the selection transistor 204 is turned on.

When the selection transistor 204 is turned on, the amplification transistor 203 amplifies the potential of the floating diffusion FD and outputs a voltage corresponding to the potential to the pixel signal line 205. The voltage output from each unit pixel 12 through the pixel signal line 205 is output to the AD conversion circuit 50 (refer to FIG. 1) as a pixel signal reading unit.

Since the gates of the transfer transistor 201, the reset transistor 202, and the selection transistor 204 are connected in row units, for example, these series of operations are performed simultaneously and in parallel for each unit pixel 12 for one row. The reset control line LRST, the transfer control line LTX, and the selection control line LSEL wired to the unit pixel 12 of FIG. 2 are wired as a set for each row of the pixel array. These reset control line LRST, transfer control line LTX, and selection control line LSEL are driven by the vertical scanning circuit 20 (refer to FIG. 1) as a pixel drive unit.

Clamping Unit 40

The clamping unit 40 clamps the pixel signal line 32 so that the potential VSIG of the analog signal read from the pixel signal line 32 is not less than or equal to a predetermined value during the auto-zero period of the second comparison circuit 54, which will be described later. The auto-zero period of the second comparison circuit 54 is a period in which the input and output of the second comparison circuit 54 is short-circuited to cancel the offset of the second comparison circuit 54. By clamping the pixel signal line 32 during the auto-zero period of the second comparison circuit 54, in the digital CDS drive method described later, it can be detected that the potential VSIG decreases due to the reception of intense light or the like during the first AD conversion period.

As illustrated in FIG. 1, the clamping unit 40 includes a clamp voltage generator 42 and a switch unit 44 provided for each column of unit pixels 12. The switch unit 44 connects the clamp voltage generator 42 to the pixel signal line 32 during the auto-zero period of the second comparison circuit 54 or a period including before and after the auto-zero period. In a period other than the auto-zero period, the switch unit 44 operates so as not to connect the clamp voltage generator 42 to the pixel signal line 32.

Figure 3:
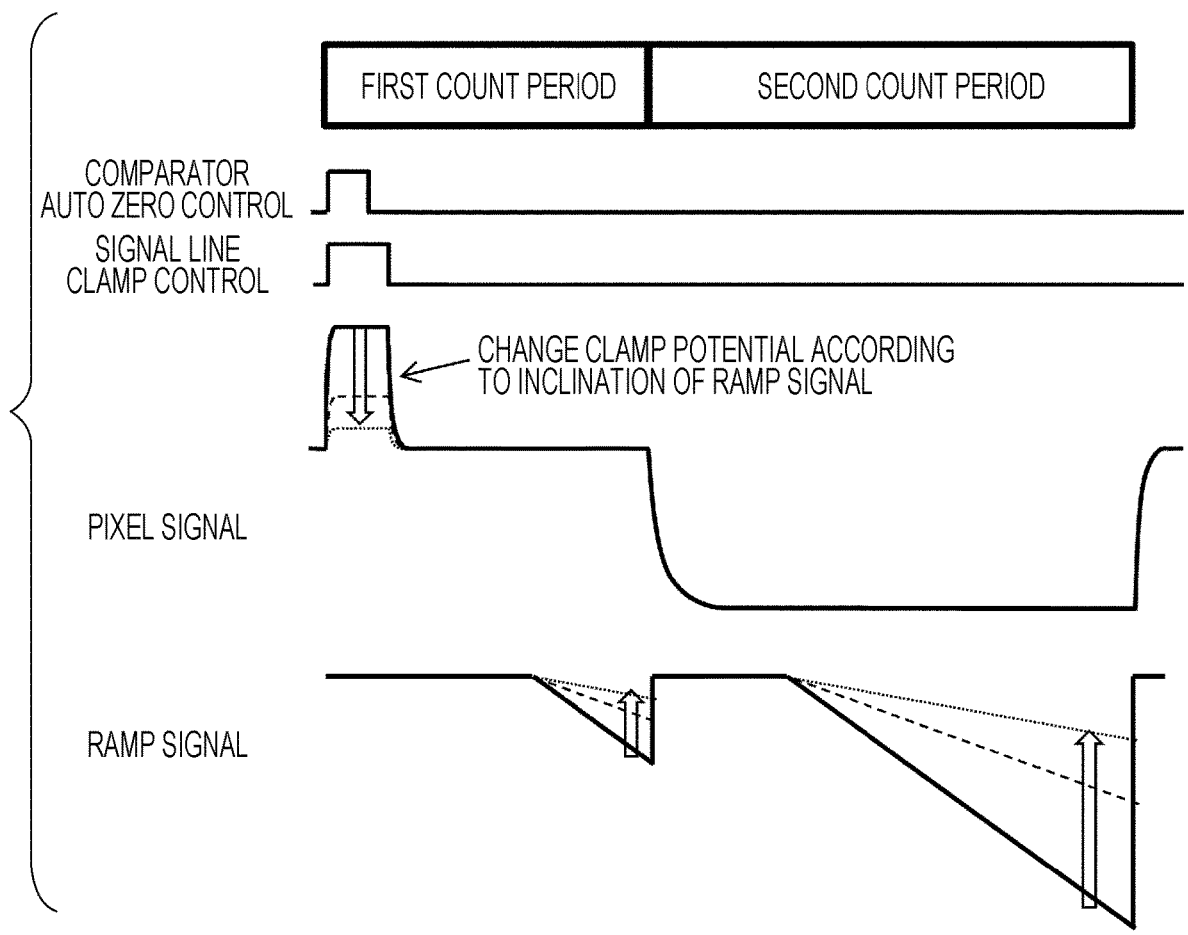
FIG. 3 is a diagram illustrating a control example of a clamp potential.

The clamp voltage generator 42 generates a clamp potential VCLAMP of the clamping unit 40 so as to be higher than the reset potential and lower than the power supply voltage of the pixel unit 10. The reason why the clamp potential VCLAMP of the clamping unit 40 is generated in this way is that, as illustrated in FIG. 3, the second reference potential VRAMP represented by the waveform of the ramp signal is changed from a high potential to a low potential. The details of the second reference potential VRAMP will be described later.

Here, the potential VSIG of the analog signal read from the pixel signal line 32 has two different potentials, a reset potential and a signal potential. In the present embodiment, the reset potential refers to the potential that is subjected to AD conversion in the first count period in the potential VSIG of the analog signal read from the pixel signal line 32. In addition, in the present embodiment, the signal potential refers to the potential that is subjected to AD conversion in the second count period in the potential VSIG of the analog signal.

Further, the clamp potential VCLAMP serves as a reference potential in AD conversion in the AD conversion circuit 50. That is, in the first count period and the second count period after the first count period, the potential difference between the potential VSIG of the analog signal read from the pixel signal line 32 and the clamp potential VCLAMP is subjected to AD conversion by the AD conversion circuit 50. Here, the potential difference between the potential VSIG and the clamp potential VCLAMP includes a first potential difference ΔVR between the reset potential of the potential VSIG and the clamp potential VCLAMP, and a second potential difference ΔVS between the signal potential of the potential VSIG and the clamp potential VCLAMP. Therefore, the offset value is included in both the count result of the first count period and the count result of the second count period. The details of the count results will be described later.

Further, as illustrated in FIG. 3, the clamp voltage generator 42 changes the clamp potential VCLAMP of the clamping unit 40 according to the slope of the waveform of the ramp signal. In a case where the slope of the waveform of the ramp signal is reduced without changing the clamp potential VCLAMP, when the AD conversion circuit 50 attempts to perform AD conversion on the first potential difference ΔVR and the second potential difference ΔVS, the determination time of the second comparison circuit 54 becomes longer. Therefore, the offset value of the count result increases.

Therefore, the offset value of the count result can be made constant by changing the clamp potential VCLAMP according to the inclination of the ramp signal. By making the offset value of the count result constant, it is possible to reduce an error in determining whether or not the intense light is received or not because the offset value of the count result is excessively increased.

The clamp voltage generator 42 changes the clamp potential VCLAMP of the clamping unit 40 so that the first potential difference ΔVR between the clamp potential VCLAMP and the reset potential is proportional to the inclination of the ramp waveform. The offset value of the count result is related to the clamp potential VCLAMP. Therefore, the clamp voltage generator 42 can increase or decrease the offset value of the count result according to the first potential difference ΔVR between the reset potential and the clamp potential VCLAMP by changing the clamp potential VCLAMP of the clamping unit 40 as described above.

AD Conversion Circuit 50 and Horizontal Scanning Circuit 30

The AD conversion circuit 50 performs AD conversion on the analog signal transferred through the pixel signal line 32 for each column of the unit pixels 12 to generate a digital signal. Specifically, the AD conversion circuit 50 performs AD conversion on the analog signals of the first potential difference ΔVR and the second potential difference ΔVS transferred through the pixel signal line 32 in each of the first count period and the second count period after the first count period. Details of the first count period and the second count period will be described later. As illustrated in FIG. 1, the AD conversion circuit 50 includes a ramp generator 52, a second comparison circuit 54, and a counter latch circuit 56.

The ramp generator 52 generates a ramp waveform that changes with time, specifically in response to a reference clock. The second comparison circuit 54 compares the first potential difference ΔVR and the second potential difference ΔVS transferred through the pixel signal line 32 with the second reference potential VRAMP, which is the potential of the ramp waveform generated by the ramp generator 52. The second comparison circuit 54 is an example of the comparison circuit according to the present disclosure, and is provided for each column of the unit pixels 12.

Figure 4:
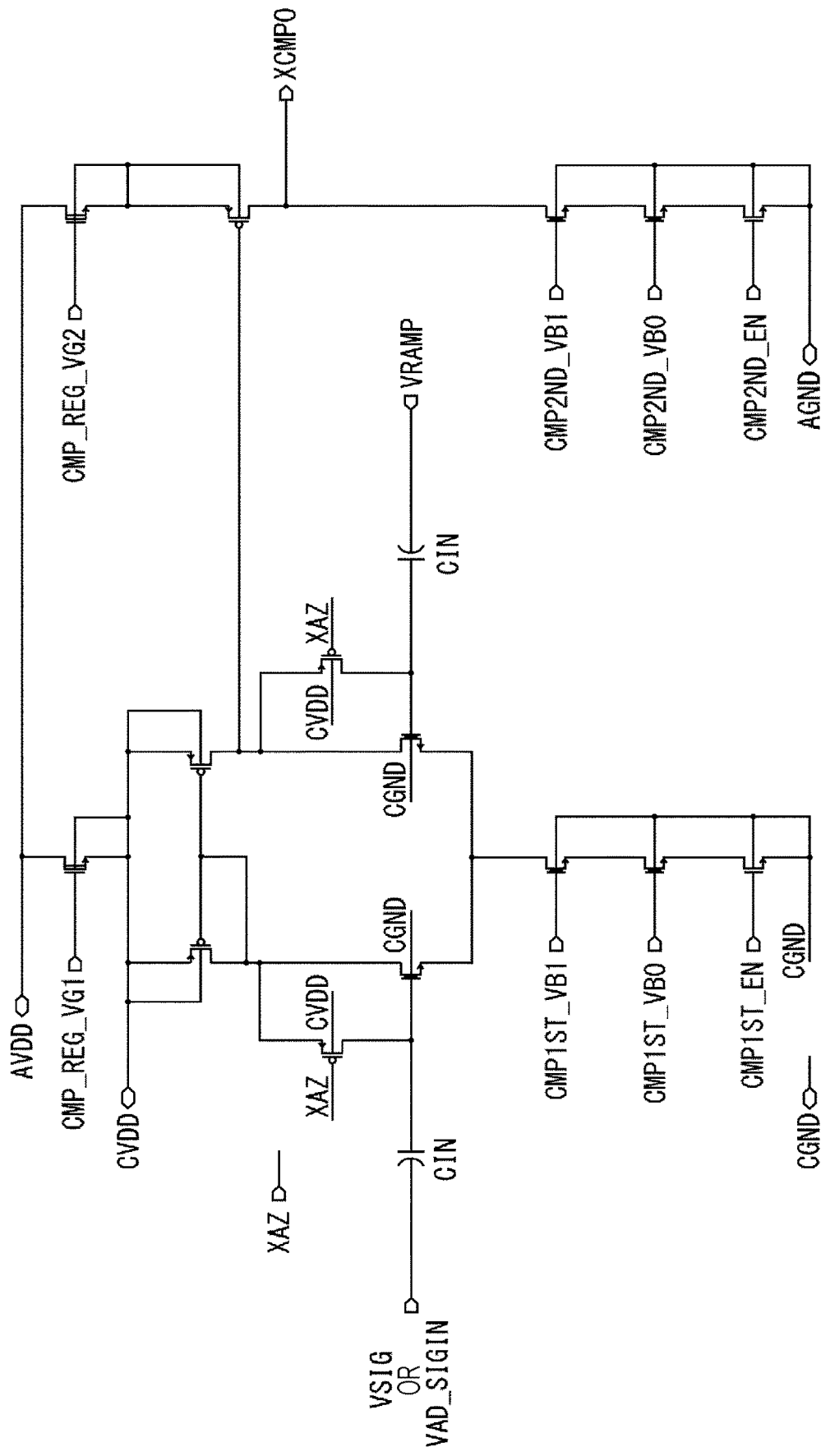
FIG. 4 is a circuit diagram illustrating a configuration example of a second comparison circuit of a solid-state image sensor according to first to third embodiments of the present disclosure.

In the present embodiment, the circuit configuration illustrated in FIG. 4 will be described as an example of the circuit configurations in which the second comparison circuit 54 can be obtained. In FIG. 4, in addition to the second comparison circuit 54, the signal VSIG or VAD_SIGIN and an input capacitor CIN of the second reference potential VRAMP are also illustrated. Specifically, if the solid-state image sensor 1 has the circuit configuration illustrated in FIG. 1 and FIG. 7 described later, a signal VSIG corresponding to the output of the pixel signal line 32 is input. On the other hand, in the circuit configuration of a solid-state image sensor 3 according to the third embodiment illustrated in FIGS. 10 and 14 described later, the signal VAD_SIGIN corresponding to the output of the pixel signal line 32 via an analog circuit 80 described later is input.

In FIG. 4, AVDD, CVDD, CGND, and AGND are an analog power supply voltage, a comparator unit regulator voltage, a 1st comparator ground, and an analog ground, respectively. CMP_REG_VG1, CMP_REG_VG2, and XAZ are a gate input voltage of a 1st comparator unit regulator voltage generation Tr, a gate input voltage of a 2nd comparator unit regulator voltage generation Tr, and an input and output short (auto-zero) control signal, respectively.

Further, in FIG. 4, CMP1ST_VB1, CMP1ST_VB0, and CMP1ST_EN are a tail bias current control voltage of a first 1st comparator, a tail bias current control voltage of a second 1st comparator, and a tail bias current on and off control signal of the 1st comparator, respectively. CMP2ND_VB1, CMP2ND_VB0, and CMP2ND_EN are a tail bias current control voltage of a first 2nd comparator, a tail bias current control voltage of a second 2nd comparator, and a tail bias current on and off control signal of the 2nd comparator, respectively.

As illustrated in FIG. 1, the counter latch circuit 56 is provided for each column of unit pixels 12, and has a counter circuit 58 and a latch circuit 59. The counter circuit 58 is a counter for digital CDS in this embodiment, and performs count processing. The counter circuit 58 starts and stops the count processing with a change in the output signal output from the second comparison circuit 54 as a trigger.

The counter circuit 58 may start the count processing before or after the start of the change of the second reference potential VRAMP. Further, the counter circuit 58 stops the count processing by using the change in the output signal as a trigger. Specifically, the counter circuit 58 stops the count processing by controlling the second comparison circuit 54 so that the clock signal described later does not change.

Further, the counter circuit 58 can perform count processing until the count value reaches a first predetermined value in the first count period. Further, the counter circuit 58 can perform count processing until the count value reaches the second predetermined value in the second count period. That is, the counter circuit 58 can count up to the first predetermined value, and cannot count beyond the first predetermined value. Similarly, the counter circuit 58 can count up to the second predetermined value, and cannot count beyond the second predetermined value.

Therefore, in the first count period, if the output of the second comparison circuit 54 does not change even if the count value reaches the first predetermined value, the counter circuit 58 stops the count processing. Similarly, in the second count period, if the output of the second comparison circuit 54 does not change even if the count value reaches the second predetermined value, the counter circuit 58 stops the count processing. As a result, the counter circuit 58 can stop the count processing even if the abnormality such as light reception of intense light occurs and the comparison result is not output from the second comparison circuit 54. The first predetermined value can be the maximum value (Drmax (refer to FIG. 6)) of the first AD conversion period. The second predetermined value can be the maximum value (Dsmax (refer to FIG. 6)) of the second AD conversion period.

Here, the period from the start to the stop of the count processing of the counter circuit 58 in the first count period is a first AD conversion period. In addition, the period from the start to the stop of the count processing of the counter circuit 58 in the second count period is a second AD conversion period. Further, the count value count-processed by the counter circuit 58 in the first count period becomes the count result in the first AD conversion period. Further, the count value count-processed by the counter circuit 58 in the second count period becomes the count result in the second AD conversion period.

The counter circuit 58 outputs the most significant bit of the first count value of the counter circuit 58 when the count processing is stopped in the first count period to the latch circuit 59 for each column of the unit pixel 12. Further, the counter circuit 58 outputs all the bits of the second count value when the count processing is stopped in the second count period to the latch circuit 59 for each column of the unit pixel 12. The details of the most significant bit of the first count value and all the bits of the second count value will be described later.

The latch circuit 59 holds the comparison result of a first comparison circuit 62 which will be described later and the first output result and all the bits of the second count value that are output from the counter circuit 58. The first output result includes the most significant bit of the first count value output from the counter circuit 58 for each column of the unit pixel 12.

As illustrated in FIG. 1, the latch circuit 59 includes a first latch circuit 591 and a second latch circuit 592. The first latch circuit 591 holds the comparison result of the first comparison circuit 62 and the first output result output from the counter circuit 58, that is, the most significant bit of the first count value for each column of the unit pixel 12. The second latch circuit 592 holds all of the bits of the second count value for each column of the unit pixel 12 output from the counter circuit 58. Further, the first latch circuit 591 is connected to a first sensor amplifier 601 and the second latch circuit 592 is connected to a second sensor amplifier 602.

The first latch circuit 591 may hold only the comparison result and may not hold the first output result. That is, the first latch circuit 591 may be a circuit that holds at least the comparison result among the comparison result and the first output result.

The horizontal scanning circuit 30 sequentially selects and reads out the values that is subjected to AD conversion in the AD conversion circuit 50 and is held in the latch circuit 59. Further, the horizontal scanning circuit 30 outputs the read result to the first sensor amplifier 601 and the second sensor amplifier 602. Specifically, the horizontal scanning circuit 30 reads out the value held in the first latch circuit 591 and outputs it to the first sensor amplifier 601. Further, the horizontal scanning circuit 30 reads out the value held in the second latch circuit 592 and outputs it to the second sensor amplifier 602.

Blackening Phenomenon Determination Circuit 60

The blackening phenomenon determination circuit 60 determines whether or not a blackening phenomenon of an image occurs in the solid-state image sensor 1, and holds the determination result. As illustrated in FIG. 1, the blackening phenomenon determination circuit 60 includes a reference potential generator 61, the first comparison circuit 62, and the latch circuit 59. The reference potential generator 61 generates a predetermined first reference potential VBSREF. The first reference potential VBSREF is a reference potential for determining whether or not the blackening phenomenon of the image occurs in the solid-state image sensor 1.

The first comparison circuit 62 is an example of the discrimination circuit according to the present disclosure, and is formed of a comparator circuit in each of the following embodiments of the present embodiment. The first comparison circuit 62 compares the reset potential of the potential VSIG of the analog signal read from the pixel signal line 32 with the first reference potential VBSREF. The first comparison circuit 62 does not have to be formed of a comparator circuit. The first comparison circuit 62 may be any circuit as long as it can discriminate whether or not the reset potential is equal to or higher than the first reference potential VBSREF.

As a result of the comparison, if the reset potential is lower than the first reference potential VBSREF, the first comparison circuit 62 determines that the reset potential is abnormal, that is, the solid-state image sensor 1 is abnormal. The reason of such a determination is because that the reset potential is a potential determined by a power supply voltage of the unit pixel 12 and a threshold potential of the reset transistor 202 (refer to FIG. 2) in a normal state, but the potential drops as if a saturation signal was output from the unit pixel 12 in the abnormal state.

In a case where it is determined that an abnormality has occurred in the solid-state image sensor 1, the first comparison circuit 62 considers that the blackening phenomenon of the image has occurred in the solid-state image sensor 1. On the other hand, if the reset potential is equal to or higher than the first reference potential VBSREF, the first comparison circuit 62 determines that the reset potential is normal, that is, the solid-state image sensor 1 is normal. The latch circuit 59 holds the comparison result output from the first comparison circuit 62. The comparison result of the first comparison circuit 62 is an example of the discrimination result according to the present disclosure, and is specifically held by the first latch circuit 591.

Post-Stage Processing Logic Circuit 70

The comparison result of the first comparison circuit 62, the first output result of the counter circuit 58, and a second output result, that are output from the latch circuit 59, are input to the post-stage processing logic circuit 70. Specifically, the second output result is an output signal of the unit pixel 12 output from the second latch circuit 592. Further, the post-stage processing logic circuit 70 outputs any one of the second output result output from the latch circuit 59 or the replacement result that is obtained by replacing the second output result with the full code (white) in the own circuit in accordance with the comparison result of the first comparison circuit 62 output from the latch circuit 59.

Specifically, in a case where the reset potential is determined to be normal by the first comparison circuit 62, the post-stage processing logic circuit 70 outputs the second output result held by the second latch circuit 592 as it is. On the other hand, in a case where the reset potential is determined to be abnormal by the first comparison circuit 62, the post-stage processing logic circuit 70 replaces the second output result held by the second latch circuit 592 with a full code and outputs the full code. The output result from the post-stage processing logic circuit 70 is the output of the solid-state image sensor 1.

Driving Example of Solid-State Image Sensor 1

A driving example of the solid-state image sensor 1 will be described with reference to FIGS. 5 and 6 and FIGS. 15 to 17 in comparison with a solid-state image sensor 100 in the related art. The solid-state image sensor 100 in the related art illustrated in FIG. 15 has the same configuration as the solid-state image sensor 1 except that the reference potential generator 61 and the first comparison circuit 62 constituting the blackening phenomenon determination circuit 60 are not provided. Further, in the solid-state image sensor 100 in the related art, a digital CDS drive method is adopted.

Driving Example in Normal State

Figure 5:
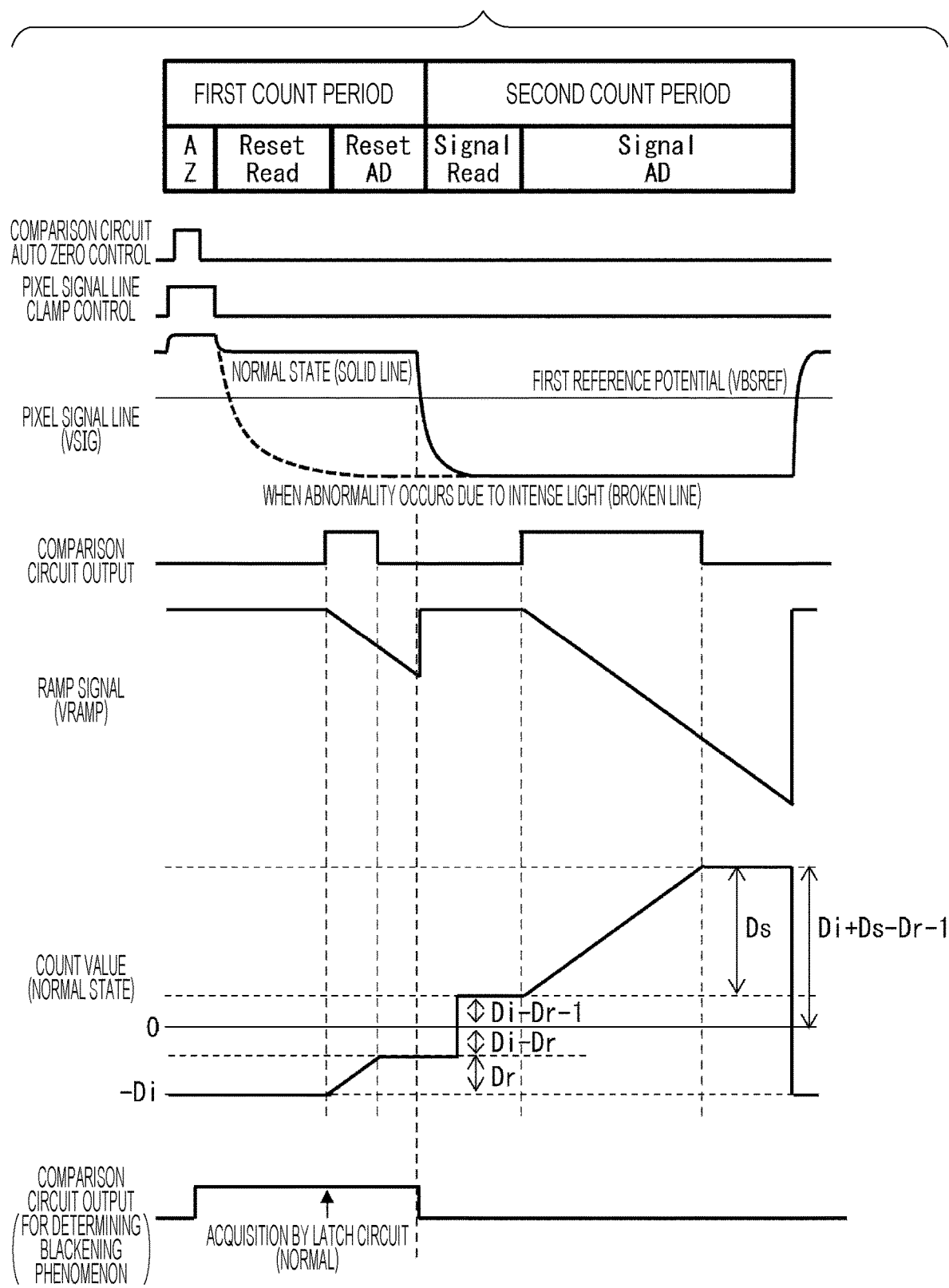
FIG. 5 is a normal driving example of the solid-state image sensor according to the first embodiment of the present disclosure.
Figure 16:
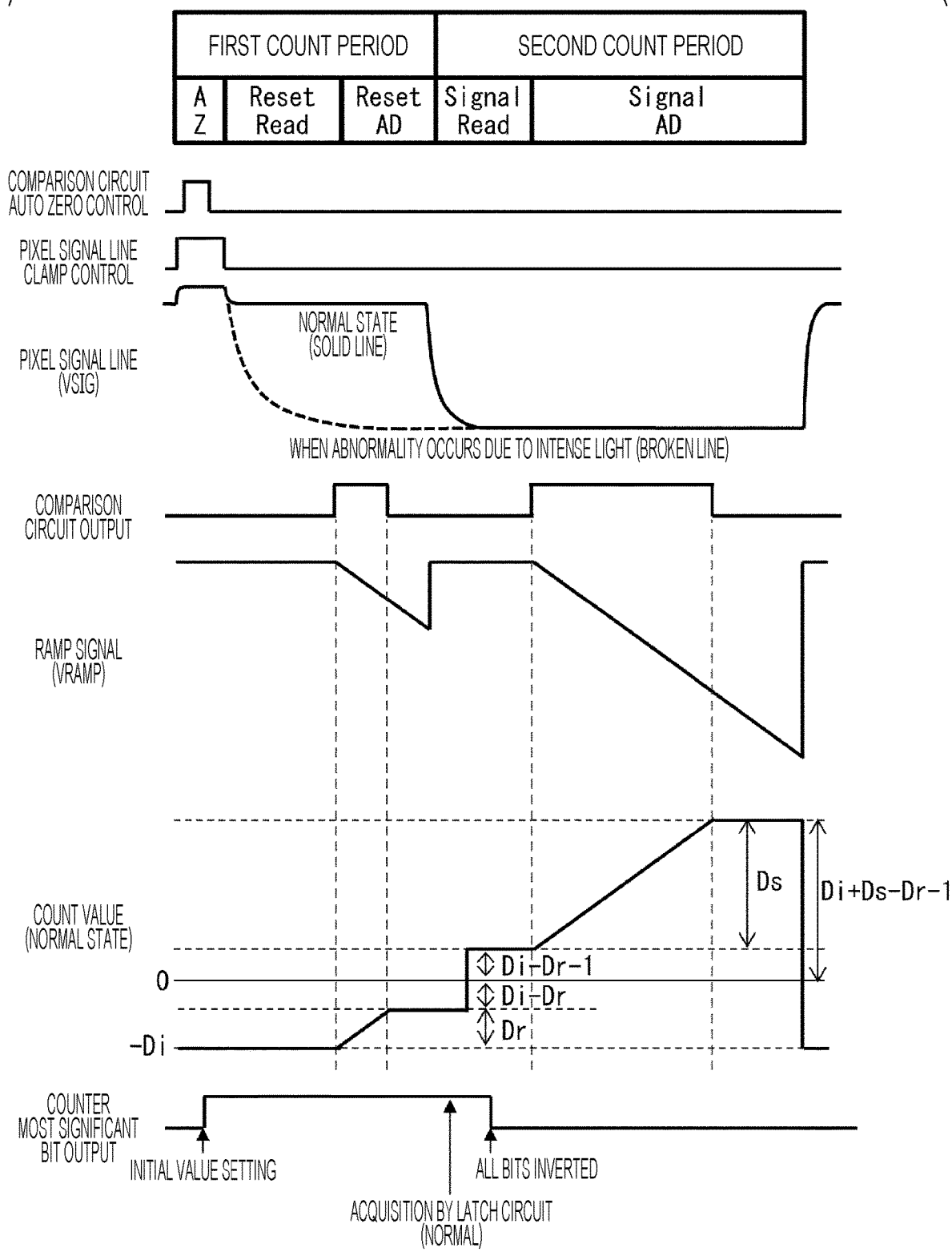
FIG. 16 is a driving example of the solid-state image sensor in the related art of the digital CDS drive method in a normal state.

As illustrated in FIGS. 5 and 16, in both the solid-state image sensor 100 in the related art and the solid-state image sensor 1, the counter circuit 58 sets the initial value of the first count processing performed during the first count period to a negative value (−Di). Next, the counter circuit 58 reads out the reset potential ("Reset Read" in FIGS. 5 and 16) and performs AD conversion on the reset potential during the first AD conversion period ("Reset AD" in FIGS. 5 and 16).

Next, in both the solid-state image sensor 100 and the solid-state image sensor 1, the counter circuit 58 performs the first count processing corresponding to the reset potential and stops the first count processing with the change in the output signal output from the second comparison circuit 54 as a trigger. Next, the first latch circuit 591 holds the first count value and the most significant bit thereof with respect to the first count value (−Di+Dr) obtained by the counter circuit 58 when the first count processing is stopped. In the normal state, the first count value is always a negative value, so that the most significant bit held in the first latch circuit 591 is always 1.

Next, in both the solid-state image sensor 100 in the related art and the solid-state image sensor 1, the counter circuit 58 sets a value (Di−Dr−1) obtained by all-bit inverting the first count value as an initial value of a second count processing performed during the second count period. During this time, the counter circuit 58 reads out the signal potential ("Signal Read" in FIGS. 5 and 16). Next, the counter circuit 58 performs AD conversion on the signal potential during the second AD conversion period ("Signal AD" in FIGS. 5 and 16).

Next, the counter circuit 58 performs the second count processing corresponding to the signal potential and stops the second count processing with the change in the output signal output from the second comparison circuit 54 as a trigger. Next, the second latch circuit 592 holds all the bits of the second count value (Di−Dr−1+Ds) obtained by the counter circuit 58 when the second count processing is stopped.

The second count value (Di−Dr−1+Ds) is a value obtained by adding a value (Ds) counted up in the second AD conversion period to a value (−(−Di+Dr)−1) obtained by inverting the value obtained by adding the initial value of the first count processing and the value counted up in the first AD conversion period. That is, the second count value is a value obtained by adding the difference between the reset potential and the signal potential and the initial value of the inverted first count processing for both the solid-state image sensor 100 in the related art and the solid-state image sensor 1.

Here, in the solid-state image sensor 100 in the related art, the reference potential generator 61 and the first comparison circuit 62 constituting the blackening phenomenon determination circuit 60 are not provided. Therefore, it is not known that, as illustrated in FIG. 16, the reset potential is normal until the counter circuit 58 stops the first count processing and outputs the most significant bit of the first count value to the first latch circuit 591 (refer to "counter most significant bit output" in FIG. 16).

On the other hand, since the solid-state image sensor 1 includes the blackening phenomenon determination circuit 60, the reset potential is determined to be normal because the first comparison circuit 62 outputs the comparison result to the latch circuit 59 as illustrated in FIG. 5 (refer to "comparison circuit output (for determining blackening phenomenon)" in FIG. 5). Therefore, the solid-state image sensor 1 can determine that the reset signal is normal not only from the most significant bit of the first count value but also from the comparison result of the first comparison circuit 62.

Driving Example in Abnormal State

As a premise for both the solid-state image sensor 100 in the related art and the solid-state image sensor 1, the maximum value (Drmax) during the first AD conversion period can set to Di+1 or more in units of one clock in a case where the initial value of the first count processing is −Di (Di: natural number). That is, the first count value in the abnormal state can be Drmax at the maximum.

Figure 6:
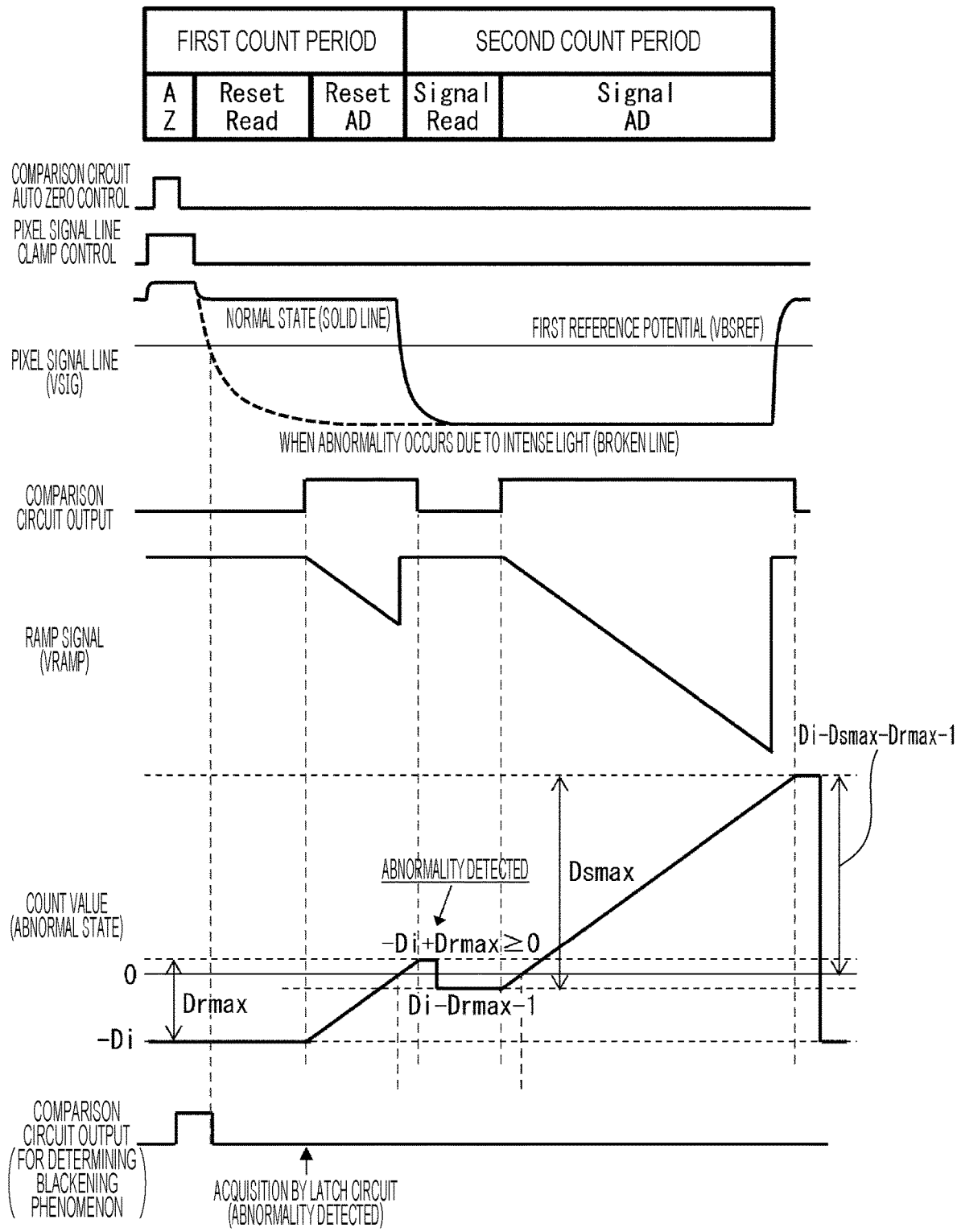
FIG. 6 is an abnormal driving example of the solid-state image sensor according to the first embodiment of the present disclosure.
Figure 17:
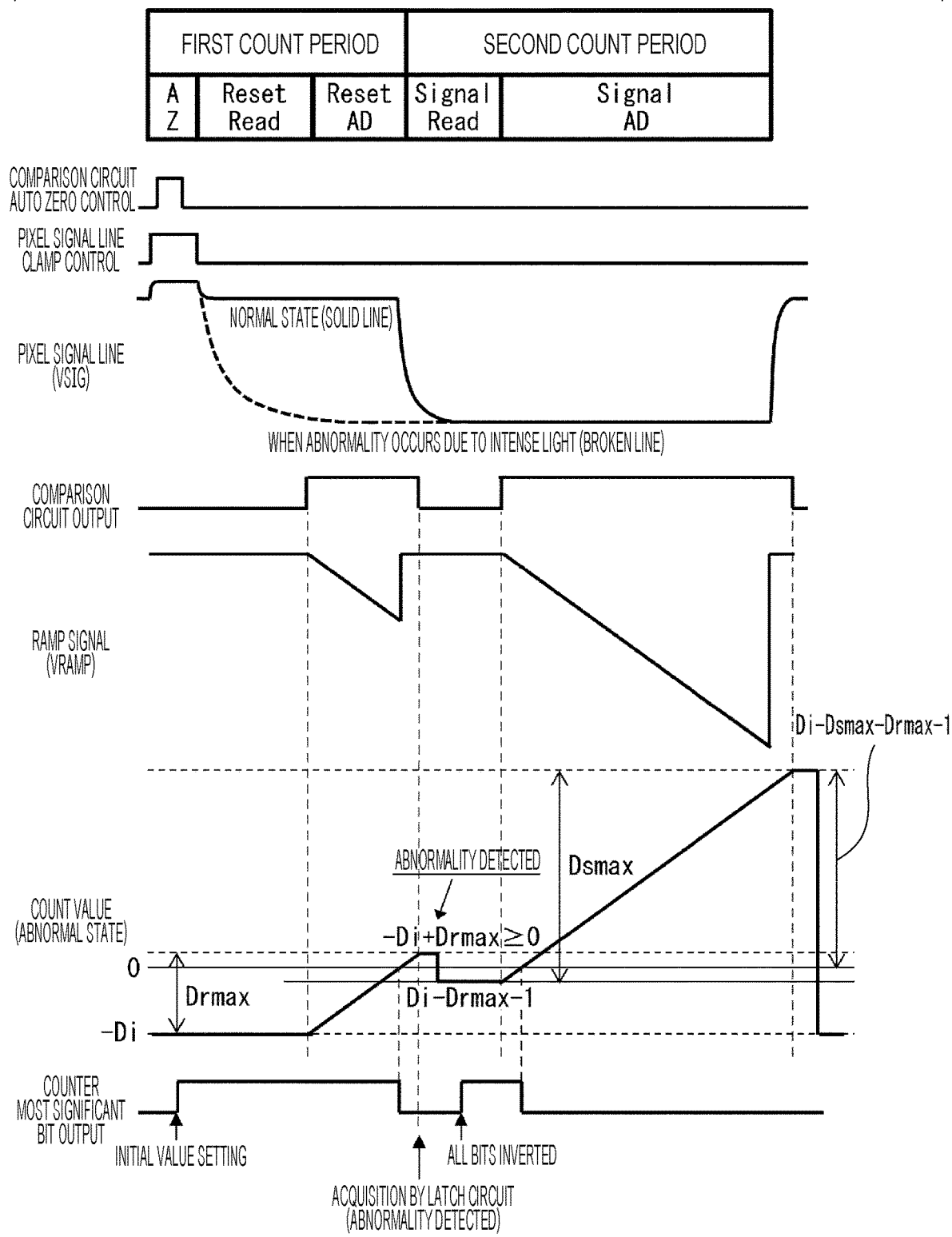
FIG. 17 is a driving example of the solid-state image sensor in the related art of the digital CDS drive method in an abnormal state.

As illustrated in FIGS. 6 and 17, the output of the second comparison circuit 54 does not change in the abnormal state in both the solid-state image sensor 100 in the related art and the solid-state image sensor 1 (period from "Reset Read" in FIGS. 6 and 17 to "Signal AD"). Therefore, the counter circuit 58 performs the first count processing until the maximum value (Drmax) of the first AD conversion period is achieved. Since the absolute value of the maximum value (Drmax) is Di or more, the first count value is 0 or more. Therefore, the most significant bit of the first count value held in the first latch circuit 591 is 0.

Here, in the solid-state image sensor 100 in the related art, the reference potential generator 61 and the first comparison circuit 62 constituting the blackening phenomenon determination circuit 60 are not provided. Therefore, it is not known that as illustrated in FIG. 17, the reset potential is abnormal until the counter circuit 58 stops the first count processing and outputs the most significant bit of the first count value to the first latch circuit 591 (refer to "counter most significant bit output" in FIG. 17).

On the other hand, since the solid-state image sensor 1 includes the blackening phenomenon determination circuit 60, the reset potential is also determined to be abnormal because the first comparison circuit 62 outputs the comparison result to the latch circuit 59 as illustrated in FIG. 6 (refer to "comparison circuit output (for determining blackening phenomenon)" in FIG. 6). Therefore, the solid-state image sensor 1 can determine that the reset signal is abnormal not only from the most significant bit of the first count value but also from the comparison result of the first comparison circuit 62. From the above, the solid-state image sensor 1 can accurately determine whether the reset potential is normal or abnormal as compared with the solid-state image sensor 100 in the related art.

Modification Example

Figure 7:
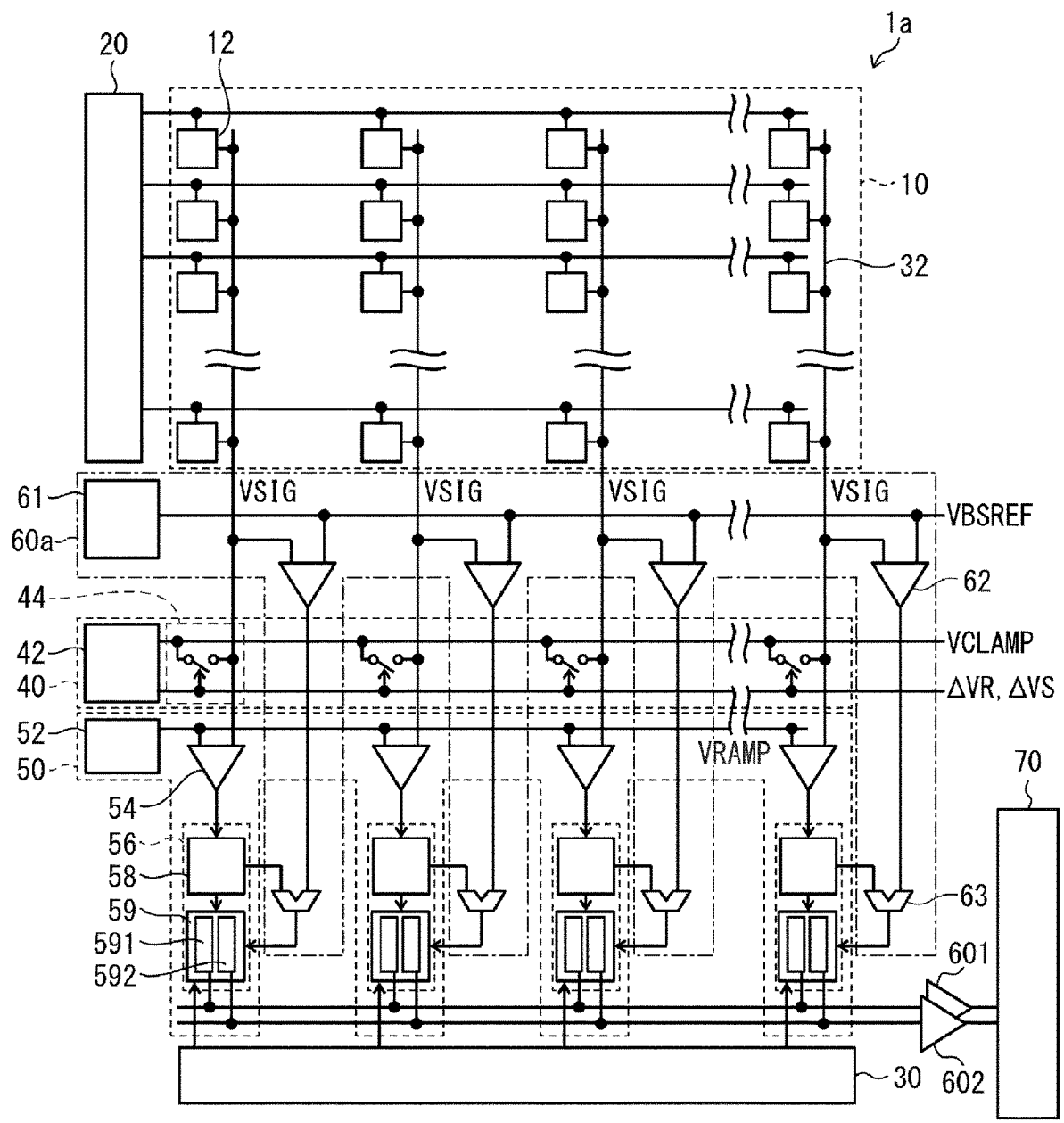
FIG. 7 is a circuit diagram illustrating a configuration example of a modification example of a solid-state image sensor according to the first embodiment of the present disclosure.

As a modification example of the solid-state image sensor 1, for example, as illustrated in FIG. 7, a solid-state image sensor 1a provided with a blackening phenomenon determination circuit 60a instead of the blackening phenomenon determination circuit 60 is assumed. A configuration of the solid-state image sensor 1a is the same as that of the solid-state image sensor 1 except for the blackening phenomenon determination circuit 60a. The blackening phenomenon determination circuit 60a includes the reference potential generator 61, the first comparison circuit 62, the latch circuit 59, and a selector 63.

The selector 63 is connected to the counter circuit 58, and acquires a first blackening phenomenon determination flag output from the counter circuit 58. The selector 63 is also connected to the first comparison circuit 62, and acquires the comparison result (second blackening phenomenon determination flag) output from the first comparison circuit 62. The selector 63 can appropriately select the first blackening phenomenon determination flag and the comparison result (second blackening phenomenon determination flag) according to the drive mode and the situation of the solid-state image sensor 1a.

As another modification example of the solid-state image sensor 1, although not shown, a solid-state image sensor provided with a blackening phenomenon suppression circuit including a field effect transistor (FET) in addition to the reference potential generator 61, the first comparison circuit 62, and the latch circuit 59 (refer to FIG. 1 for all of them) is also assumed. A configuration of the solid-state image sensor in another modification example is the same as that of the solid-state image sensor 1 except for blackening phenomenon suppression circuit.

The latch circuit 59 holds the comparison result of the first comparison circuit 62 and controls the gate of the FET during the sampling period of the reset potential. The gate of the FET is controlled by receiving a gate voltage corresponding to the comparison result of the first comparison circuit 62 from the latch circuit 59. Specifically, in a case where the comparison result indicating that it is normal is held in the latch circuit 59, the operation of the gate of the FET is turned off by the latch circuit 59. On the other hand, in a case where the comparison result indicating that it is abnormal is held in the latch circuit 59, the operation of the gate of the FET is turned on by the latch circuit 59. When the gate operation is turned on, the potential VSIG of the analog signal read from the pixel signal line 32 (refer to FIG. 1) is lifted so as to have a potential equal to or higher than the reset potential and equal to or lower than the power supply voltage of the pixel unit 10 (refer to FIG. 1). As a result, it is possible to restrain the reset potential from falling below the first reference potential VBSREF when the solid-state image sensor according to another modification example is abnormal, and as a result, the blackening phenomenon of the image can be suppressed.

Second Embodiment

Outline of Solid-State Image Sensor 2

A configuration of the solid-state image sensor 2 according to the second embodiment of the present disclosure is the same as the configuration of the solid-state image sensor 1 according to the first embodiment of the present disclosure illustrated in FIG. 1. Further, the configuration of the second comparison circuit 54 of the solid-state image sensor 2 is the same as the configuration of the second comparison circuit 54 of the solid-state image sensor 1 illustrated in FIG. 4. The configuration of the second comparison circuit 54 of the solid-state image sensor 3 to be described later is the same as the configuration of the second comparison circuit 54 of the solid-state image sensor 1 illustrated in FIG. 4.

The AD conversion circuit 50 performs AD conversion on a reference potential, that is, a clamp potential VCLAMP in the first AD conversion period of the first count period. Further, the AD conversion circuit 50 performs AD conversion on the differential potential, which is the difference between the reset potential and the signal potential with reference to the second reference potential VRAMP, in the second AD conversion period of the second count period. Each of the reset potential, the signal potential, and the differential potential is subjected to analog CDS processing.

Further, the AD conversion circuit 50 digitally performs CDS processing on each of the result of the AD conversion in the first AD conversion period and the result of the AD conversion in the second AD conversion period. As a result, the variation between the unit pixels 12 can be reduced by analog CDS processing, and the variation of the first comparison circuit 62 (comparator circuit) for each column can be reduced by digital CDS processing. Note that, the analog CDS processing can be realized by controlling the operation of a capacitor and an AZ switch (both not shown) in the differential input unit in the first comparison circuit 62 and changing the driving method.

Driving Example of Solid-State Image Sensor 2

Figure 15:
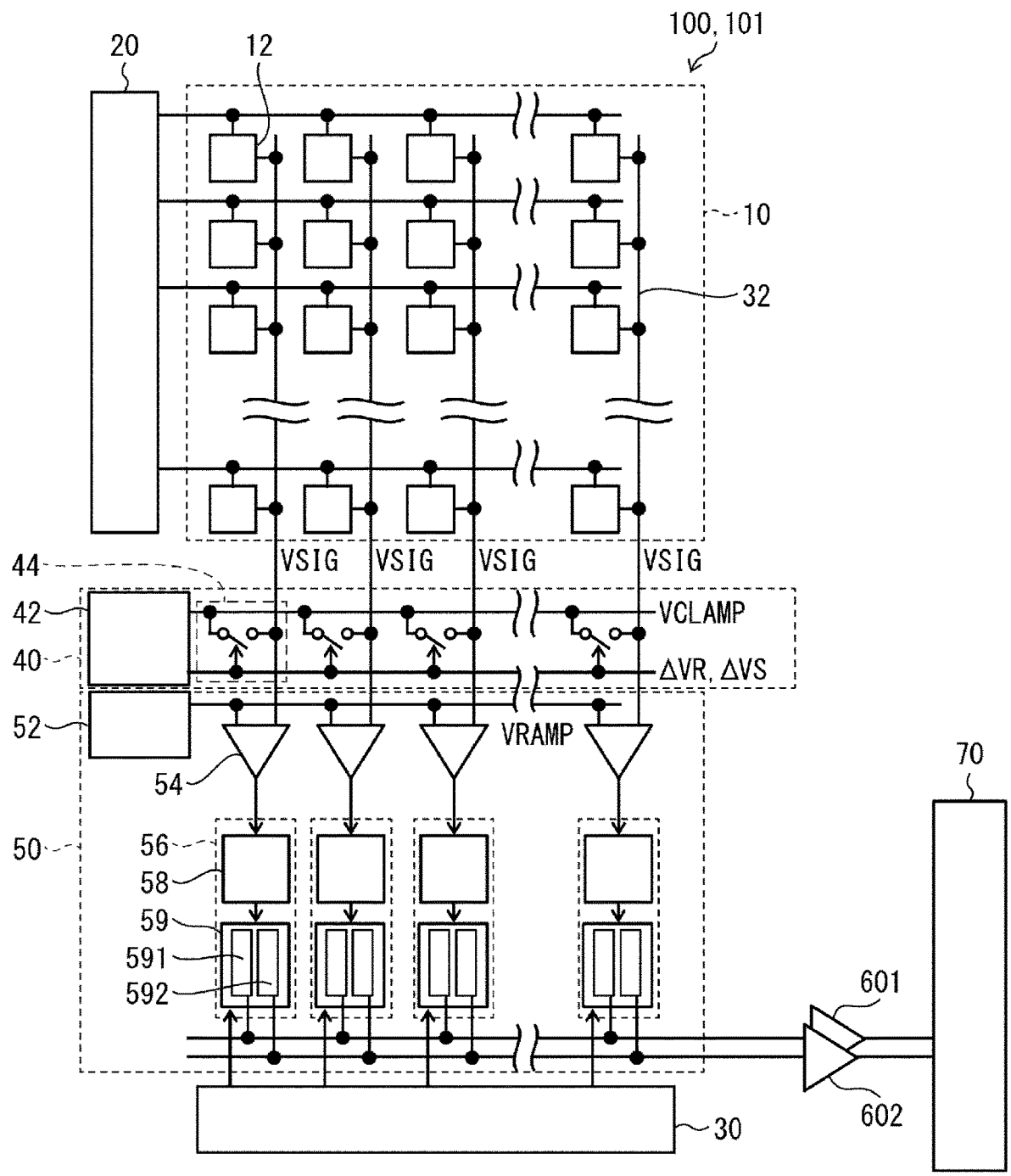
FIG. 15 is a circuit diagram illustrating a configuration example of the solid-state image sensor in the related art of a digital CDS drive method and a hybrid CDS drive method.

A driving example of the solid-state image sensor 2 will be described with reference to FIGS. 8, 9, 15, and 18 in comparison with a solid-state image sensor 101 in the related art as illustrated in FIG. 15. The solid-state image sensor 101 in the related art has the same configuration as the solid-state image sensor 2 except that the reference potential generator 61 and the first comparison circuit 62 constituting the blackening phenomenon determination circuit 60 are not provided.

Figure 8:
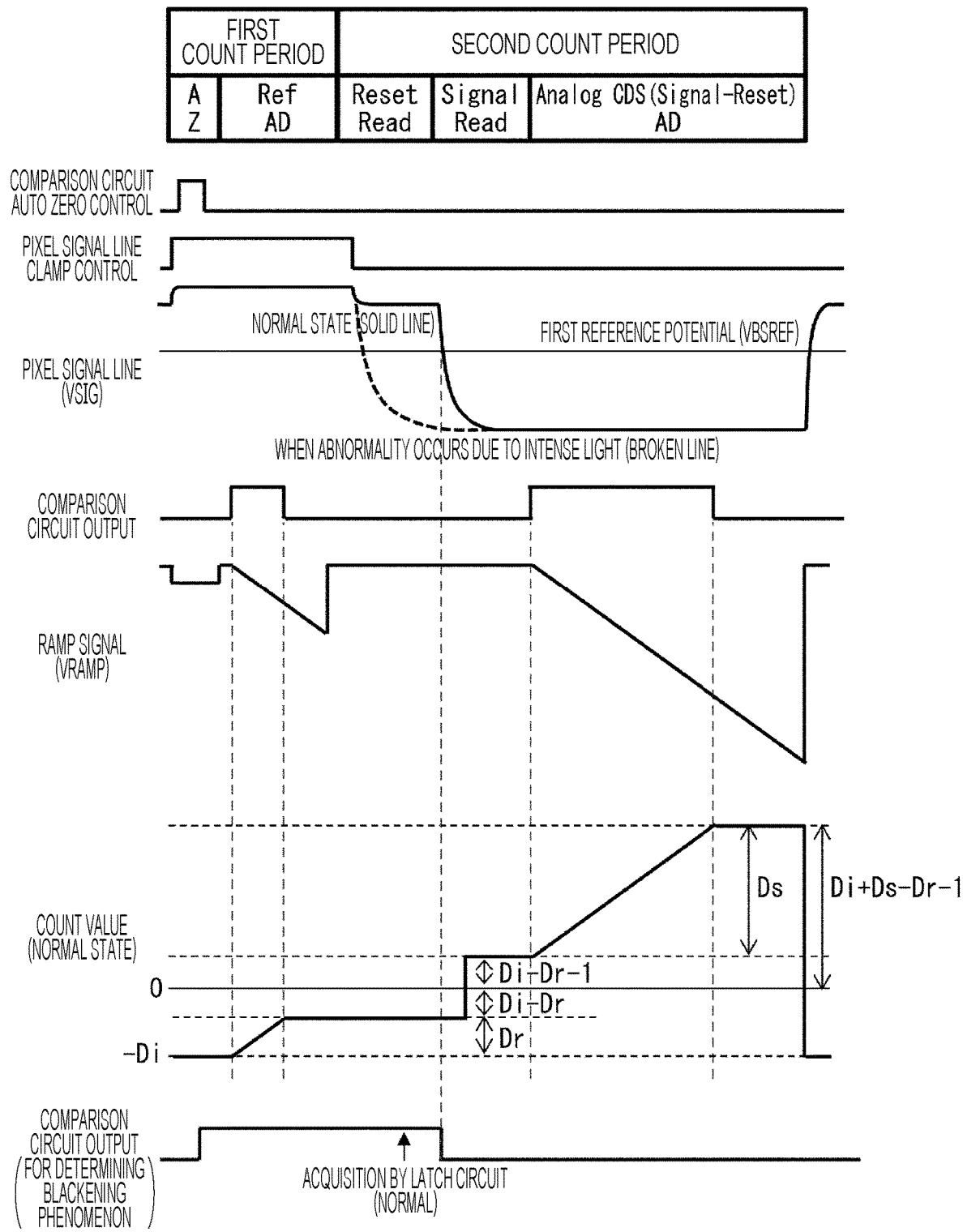
FIG. 8 is a normal driving example of the solid-state image sensor according to the second embodiment of the present disclosure.
Figure 9:
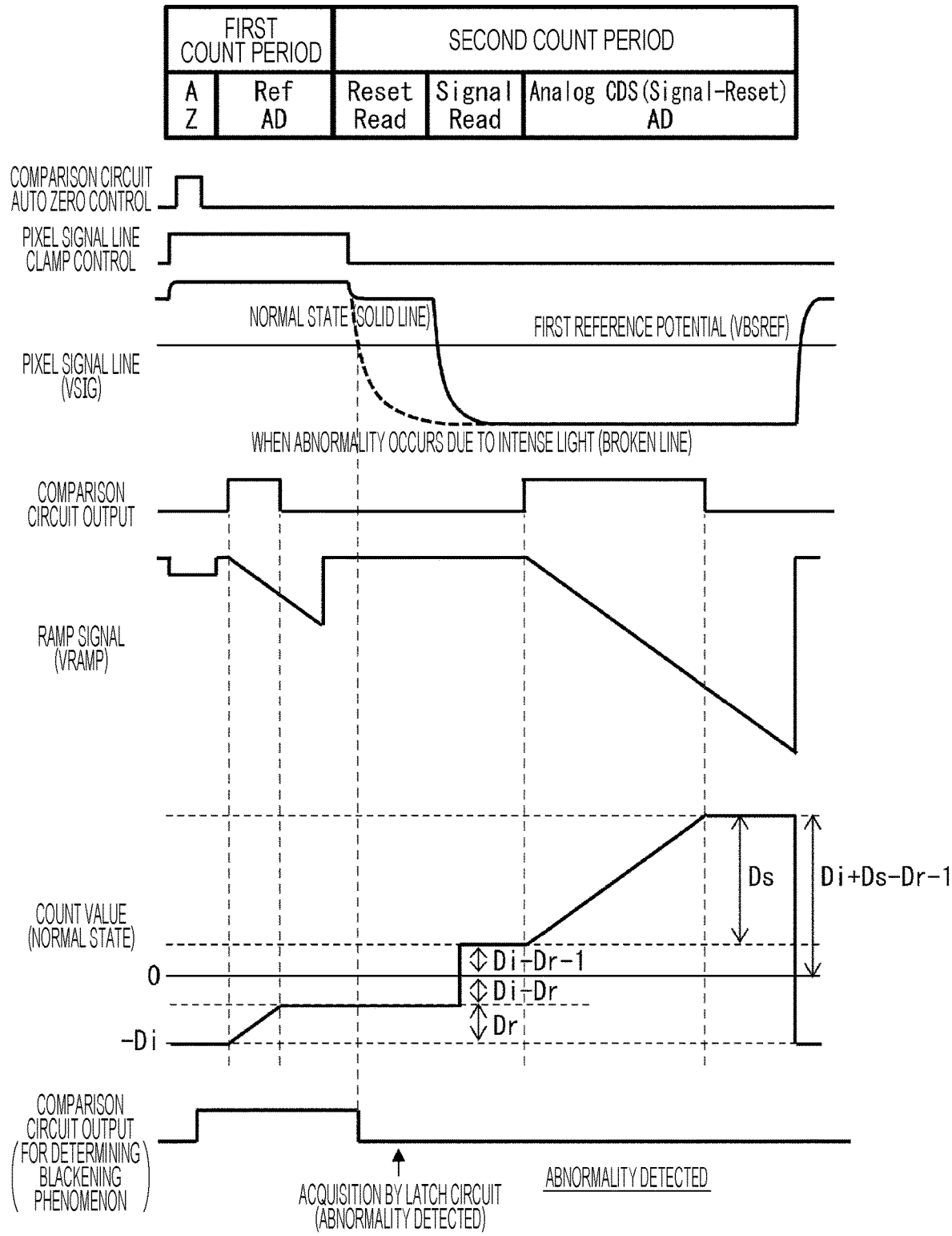
FIG. 9 is an abnormal driving example of the solid-state image sensor according to the second embodiment of the present disclosure.
Figure 18:
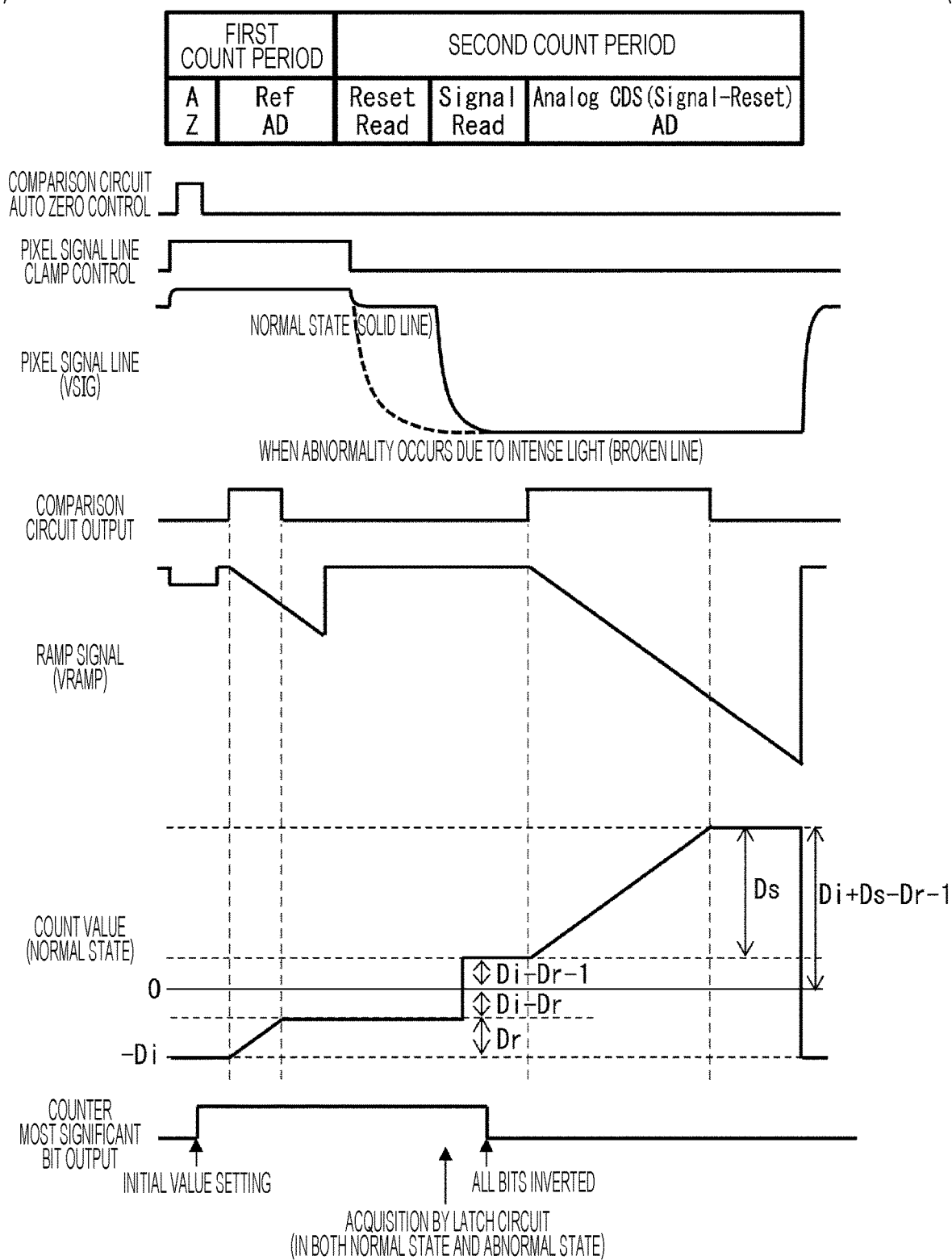
FIG. 18 is a driving example of the solid-state image sensor in the related art of the hybrid CDS drive method in the normal state or the abnormal state.

As illustrated in FIGS. 8, 9, and 18, in both the solid-state image sensor 101 in the related art and the solid-state image sensor 2, the point that the first latch circuit 591 holds the first count value (−Di+Dr) and the most significant bit thereof is the same as that of the first embodiment. Further, the point that the most significant bit held in the first latch circuit 591 is always 1 in the normal state is the same as that of the first embodiment. Further, in both the solid-state image sensor 101 in the related art and the solid-state image sensor 2, the point that the second latch circuit 592 holds all the bits of the second count value (Di−Dr−1+Ds) is the same as that in the first embodiment.

Here, since both the solid-state image sensor 101 in the related art and the solid-state image sensor 2 read out each of the reset potential and the signal potential to generate the differential potential, the information related to the reset potential disappears at this point. Therefore, in the solid-state image sensor in the related art that does not include the blackening phenomenon determination circuit 60, it becomes difficult to know that the reset is abnormal. The period until each of the reset potential and the signal potential is read out to generate the differential potential corresponds to the period from "Reset Read" to "Signal Read" in FIGS. 8, 9, and 18.

On the other hand, the solid-state image sensor 2 includes a blackening phenomenon determination circuit 60. Therefore, it is clear from the comparison result of the first comparison circuit 62 that the reset potential is normal and abnormal (refer to "comparison circuit output (for determining the blackening phenomenon)" in FIGS. 8 and 9). Therefore, even in a case where a counter for digital CDS is used as the counter circuit 58 in the solid-state image sensor 2 in the hybrid CDS drive method, it is possible to suppress the blackening phenomenon of the image while minimizing the increase in the circuit scale.

Third Embodiment

Figure 10:
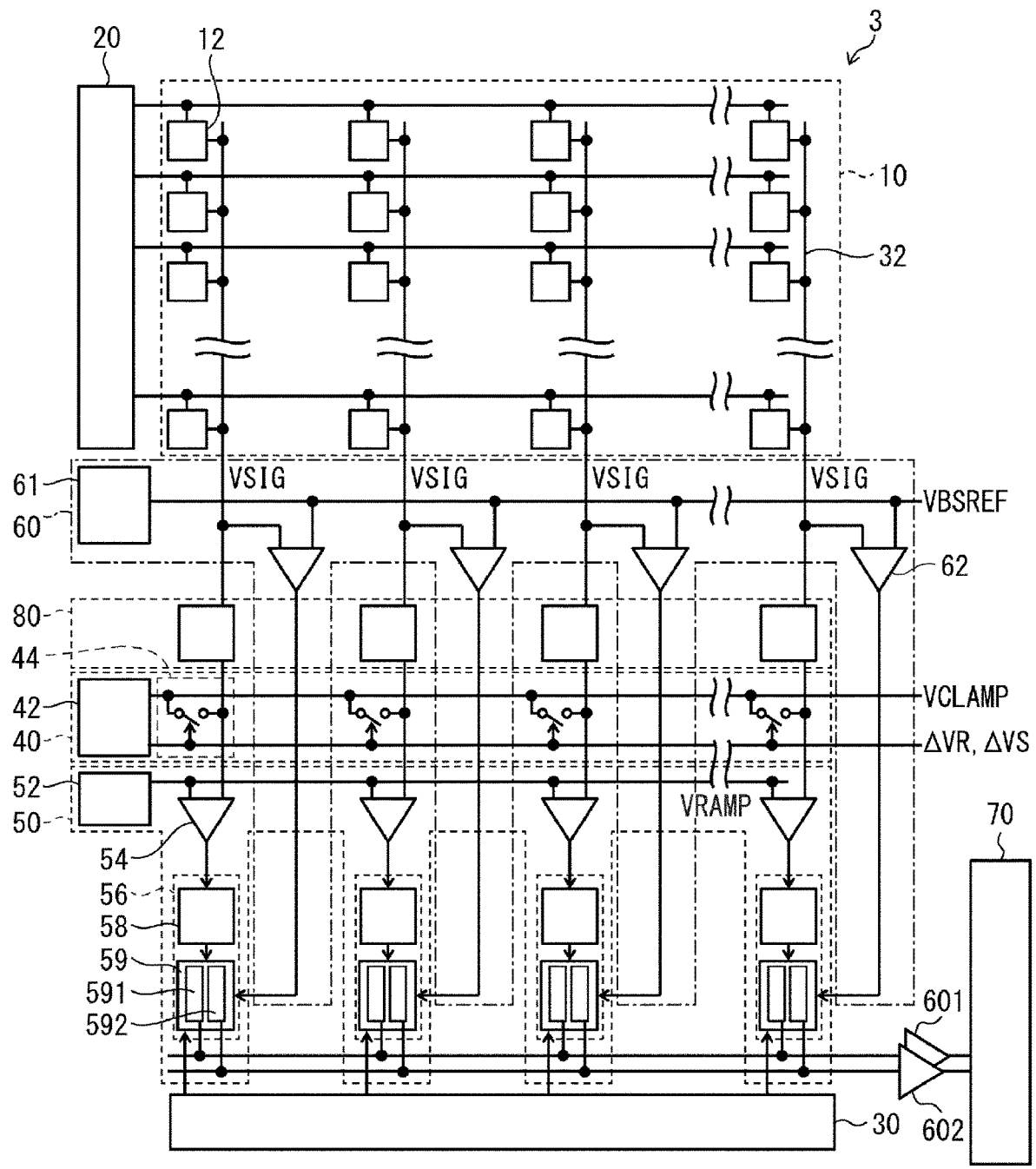
FIG. 10 is a circuit diagram illustrating a configuration example of a solid-state image sensor according to the third embodiment of the present disclosure.
Figure 11:
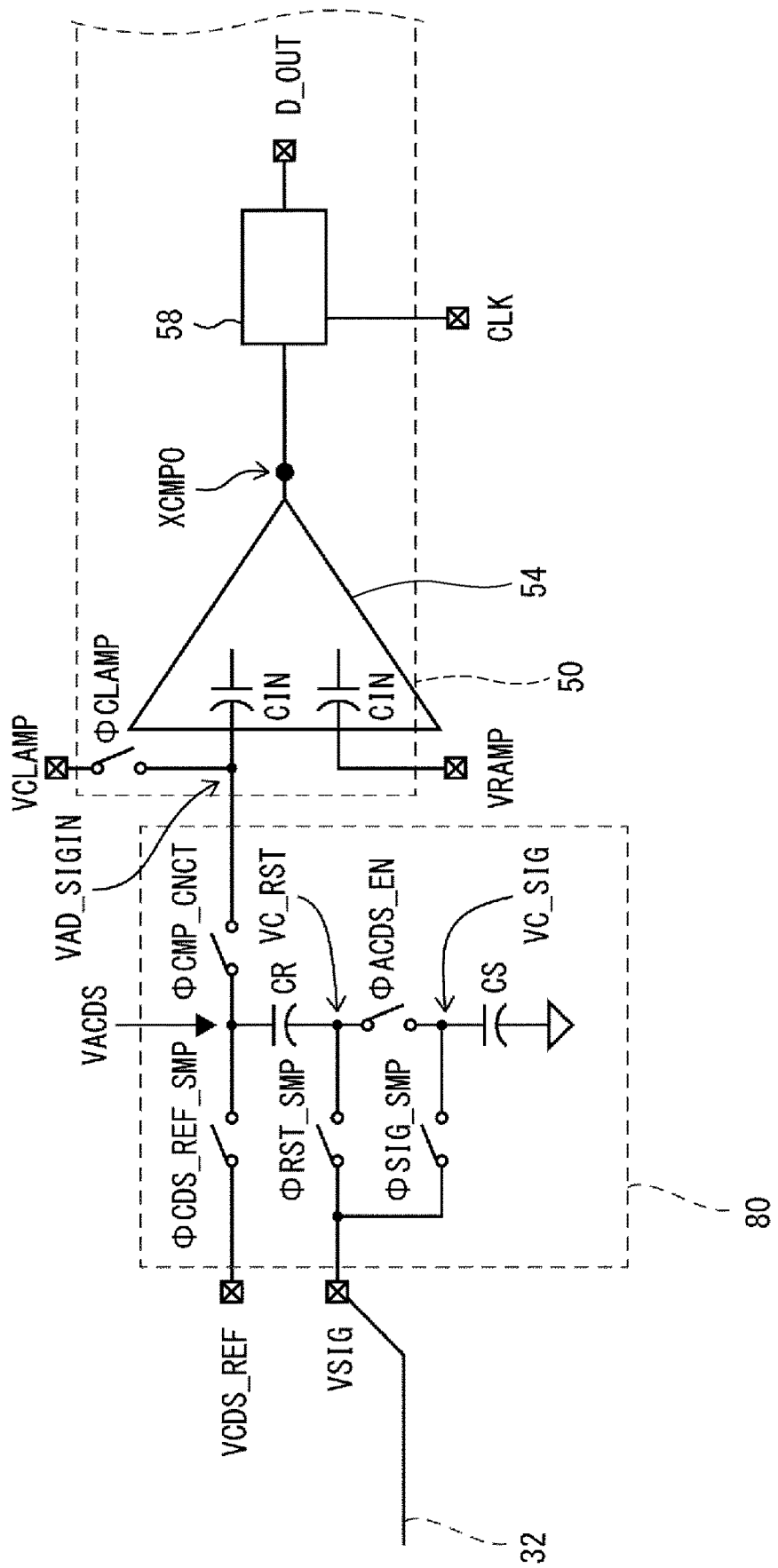
FIG. 11 is a circuit diagram illustrating a configuration example of an analog circuit of the solid-state image sensor according to the third embodiment of the present disclosure.

The solid-state image sensor 3 according to the third embodiment of the present disclosure will be described with reference to FIGS. 10 to 14. As illustrated in FIG. 10, the solid-state image sensor 3 is different from the solid-state image sensors 1 and 2 according to the first and second embodiments of the present disclosure in that it includes the analog circuit 80. Other configurations of the solid-state image sensor 3 are the same as those of the solid-state image sensors 1 and 2.

Analog Circuit 80 and AD Conversion Circuit 50

The analog circuit 80 outputs the differential potential, which is the difference between the reset signal and the signal potential with reference to the second reference potential VRAMP to the AD conversion circuit 50. Here, the configuration of the analog circuit 80 will be described with reference to FIG. 11. In the following description, the side closer to an input end of the analog circuit 80 is referred to as an input side, and the side closer to a digital output end of the AD conversion circuit 50 is referred to as an output end. The analog circuit 80 is branched into two from the input end where the potential VSIG of the analog signal read out from the pixel signal line 32 is input, and a switch SIG_SMP and a switch RST_SMP are connected. Further, a reference potential VCDS_REF is also input to the analog circuit 80 and is connected to a switch CDS_REF_SMP.

A capacitor CS (second capacitor) is provided between the output side (voltage label VC_SIG) of the switch SIG_SMP and a ground. A switch ACDS_EN is provided between the output side of the switch SIG_SMP and the output side of the switch RST_SMP (voltage label VC_RST). A capacitor CR (first capacitor) is provided between the output side of the switch RST_SMP and the output side (voltage label VACDS) of the switch CDS_REF_SMP. A switch CMP_CNCT is provided between the output side of the switch CDS_REF_SMP (one end of the capacitor CR) and the output of the analog circuit 80 (voltage label VAD_SIGIN).

The AD conversion circuit 50 first performs AD conversion on the second reference potential VRAMP output from the ramp generator 52. Next, the AD conversion circuit 50 sequentially reads out the first potential difference ΔVR between the reset potential and the clamp potential VCLAMP and the second potential difference ΔVS between the signal potential and the clamp potential VCLAMP. Next, the counter circuit 58 of the AD conversion circuit 50 performs hybrid CDS processing on the differential potential acquired from the analog circuit 80. Finally, the AD conversion circuit 50 performs AD conversion on the differential potential processed by the hybrid CDS and outputs it from the counter circuit 58 to the latch circuit 59 as the first output result.

Driving Example of AD Converter

Figure 12:
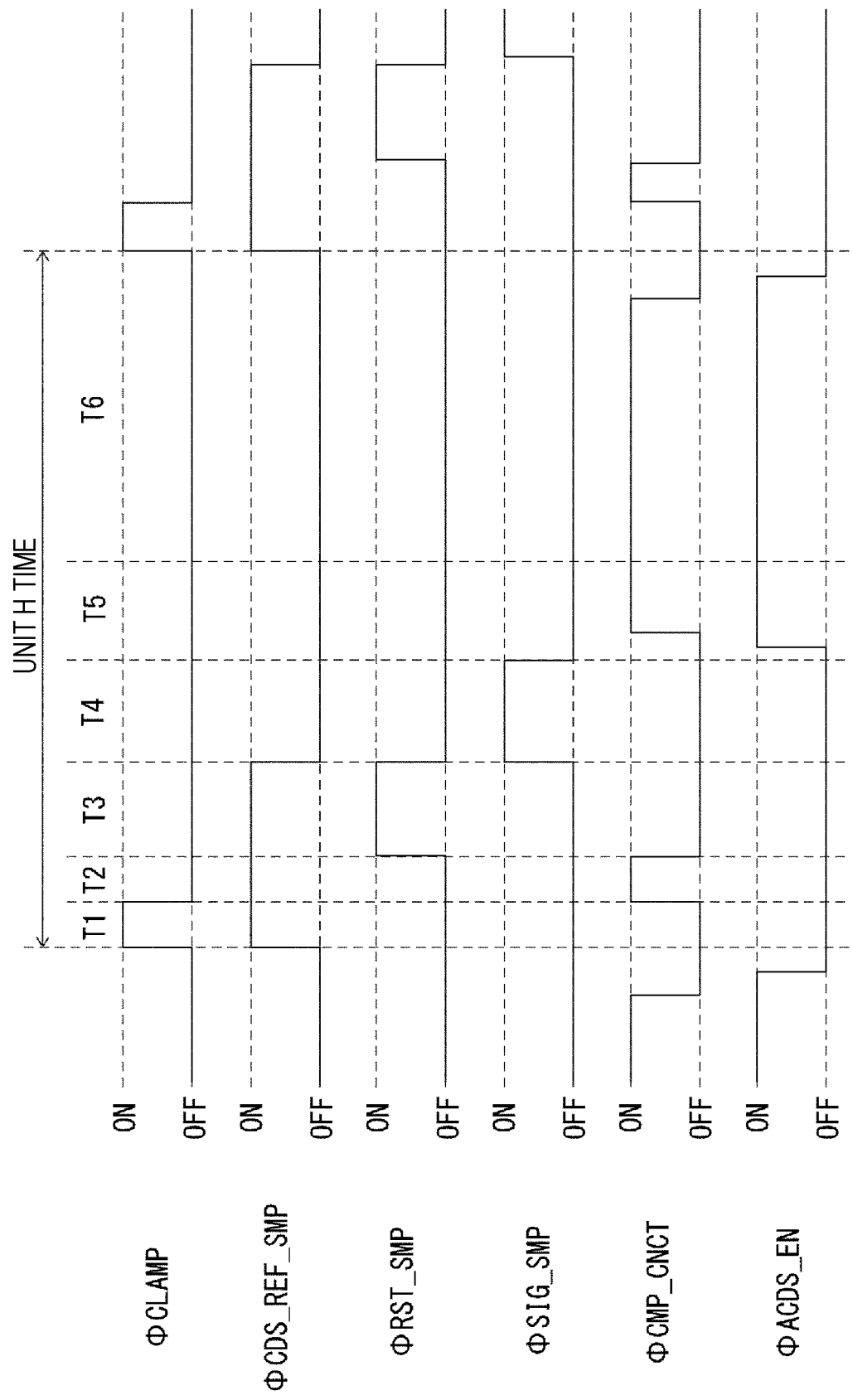
FIG. 12 is a driving example of an AD converter of the solid-state image sensor according to the third embodiment of the present disclosure.
Figure 13:
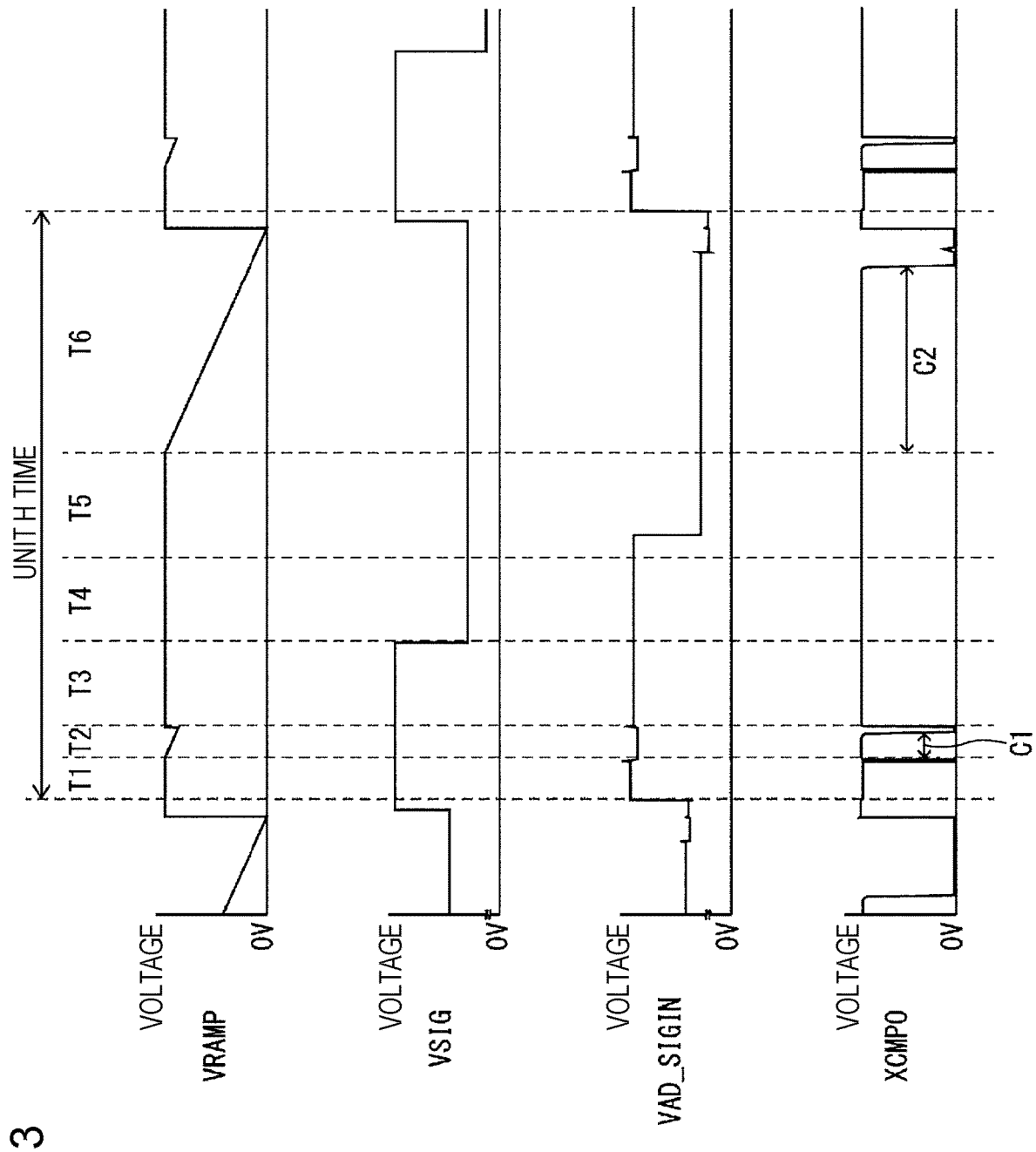
FIG. 13 is a driving example of an AD converter of the solid-state image sensor according to the third embodiment of the present disclosure.

Hereinafter, a driving example of the AD converter will be described with reference to FIGS. 12 and 13. The AD converter is formed of the analog circuit 80 in the front stage and the AD conversion circuit 50 in the rear stage.

Period T1 (auto-zero period): First, the switch CDS_REF_SMP and the switch CLAMP are turned on. Other switches are in an off state. At the same time that the clamp potential VCLAMP is applied to the input terminal of the second comparison circuit 54, the input and output of the second comparison circuit 54 are short-circuited (input and output short control signal XAZ is turned on) to be in an auto-zero state. At the end of the period, the switch CLAMP is turned off (the input and output short control signal XAZ is also turned off).

Period T2 (AD conversion period of reference potential): the switch CMP_CNCT is turned on. Then, an input voltage VAD_SIGIN of the second comparison circuit 54 becomes equal to the reference potential VCDS_REF. Then, the counter circuit 58 (refer to FIG. 11) starts counting the number of clocks and the voltage change of the second reference voltage VRAMP is started (single slope type AD conversion starts). Here, the second reference voltage VRAMP is a constant value VRAMP (ST) having a potential slightly higher than the reference potential VCDS_REF in the normal state, but is a signal that linearly decreases with a constant slope with time when the voltage change is started. Note that, the voltage change is not limited to a downward direction but may be in an upward direction.

When the voltage change ends, the second reference voltage VRAMP returns to the initial constant value. At the start of the voltage change, the second reference voltage VRAMP has a higher potential than the input voltage VAD_SIGIN to the second comparison circuit 54. When the magnitude relationship is reversed as the potential of the second reference voltage VRAMP drops, a comparator output XCMPO is inverted. When the inversion of the comparator output XCMPO is detected, the counter circuit 58 ends counting. (Single slope type AD conversion ends). Therefore, here, the reference potential VRAMP (ST)–VCDS_REF with reference to VRAMP (ST) is converted into a count number. Further, in the AD conversion of the reference potential (period T2), the down count is performed. When the count stops, the switch CMP_CNCT is turned off and the period T2 ends.

Period T3 (reset potential sampling period): The AD converter operates to adapt the period T3 to the period during which the unit pixel 12 outputs the reset potential VSIG (RST) as the output signal VSIG. The switch RST_SMP is turned on. Then, the potentials at both ends of the capacitor CR are VACDS=VCDS_REF and VC_RST=VSIG (RST), respectively. At the end of period T3, the switch RST_SMP and the switch CDS_REF_SMP are turned off.

Period T4 (Signal potential sampling period): The AD converter operates to adapt the period T4 to the period during which the unit pixel 12 outputs the signal potential VSIG (SIG) as the output signal VSIG. The switch SIG_SMP is turned on. Then, the potential VC_SIG of the terminal on the output side of the capacitor CS becomes VSIG (SIG). The potentials of the other terminals of the capacitor CS are grounded, and thus are always 0. At the end of period T4, the switch SIG_SMP is turned off.

Period T5 (CDS period): The switch ACDS_EN is turned on. Generally, each capacitor attempts to maintain the potential difference between both ends unless electric charge goes in and out. The potential VC_SIG of the terminal on the output side of the capacitor CS does not change from the period T4 and is VSIG (SIG). The capacitor CR is charged so that the potential difference between both ends becomes VCDS_REF−VSIG (RST) during the period T3. During the subsequent period T4 after that, all switches connected to the capacitor CR are turned off. Therefore, the capacitor CR operates so as to maintain the potential difference VACDS−VC_RST at both ends to VCDS_REF−VSIG (RST) even in the period 5.

Therefore, as a result of connecting the capacitors CR and CS in series by turning on the switch ACDS_EN, the potential differences between capacitors are combined. Then, the potential VACDS of the terminal on the output side of the capacitor CR is the synthetic potential VSIG (SIG)+VCDS_REF−VSIG (RST)=VC. That is, a synthetic potential VC is obtained by subtracting the reset potential VSIG (RST) from the reference potential VCDS_REF and further adding the signal potential VSIG (SIG). Further, the synthetic potential is the difference VSIG (SIG)−VSIG (RST) between the reset potential and the signal potential with reference to the reference potential. Next, when the switch CMP_CNCT is turned on, the input voltage VAD_SIGIN of the second comparison circuit 54 is set to the present synthetic potential VC.

Period T6 (AD conversion period of synthetic potential): The clock is counted by the counter circuit 58 and the voltage change of the second reference voltage VRAMP is executed, and the single slope type AD conversion is performed in the same manner as in the above period T2. Then, here, the synthetic potential VC based on VRAMP (ST) is converted into the count number. Further, in the AD conversion of the synthetic potential (period T6), the count number is taken over from the end of the down count in the AD conversion of the reference potential (period T2) and the up count is performed.

Therefore, when the AD conversion of the synthetic potential VC (period T6) ends, the count number corresponds to the difference between the AD conversion value of the synthetic potential and the AD conversion value of the reference potential. That is, VSIG (RST)−VSIG (SIG) corresponds to the final count number and is output from the AD converter as a digital output D_OUT. At the end of period T6, the switch ACDS_EN and the switch CMP_CNCT are turned off.

As described above, in the periods T1 to T6, the reading out of one unit pixel by the AD converter and the AD conversion process thereof are completed. Therefore, in the third embodiment, a unit H time (unit horizontal time), which is the cycle in which the AD converter reads out one unit pixel and also the cycle in which the digital output for one unit pixel is performed, is equal to the period from period T1 to the period T6.

Modification Example

Figure 14:
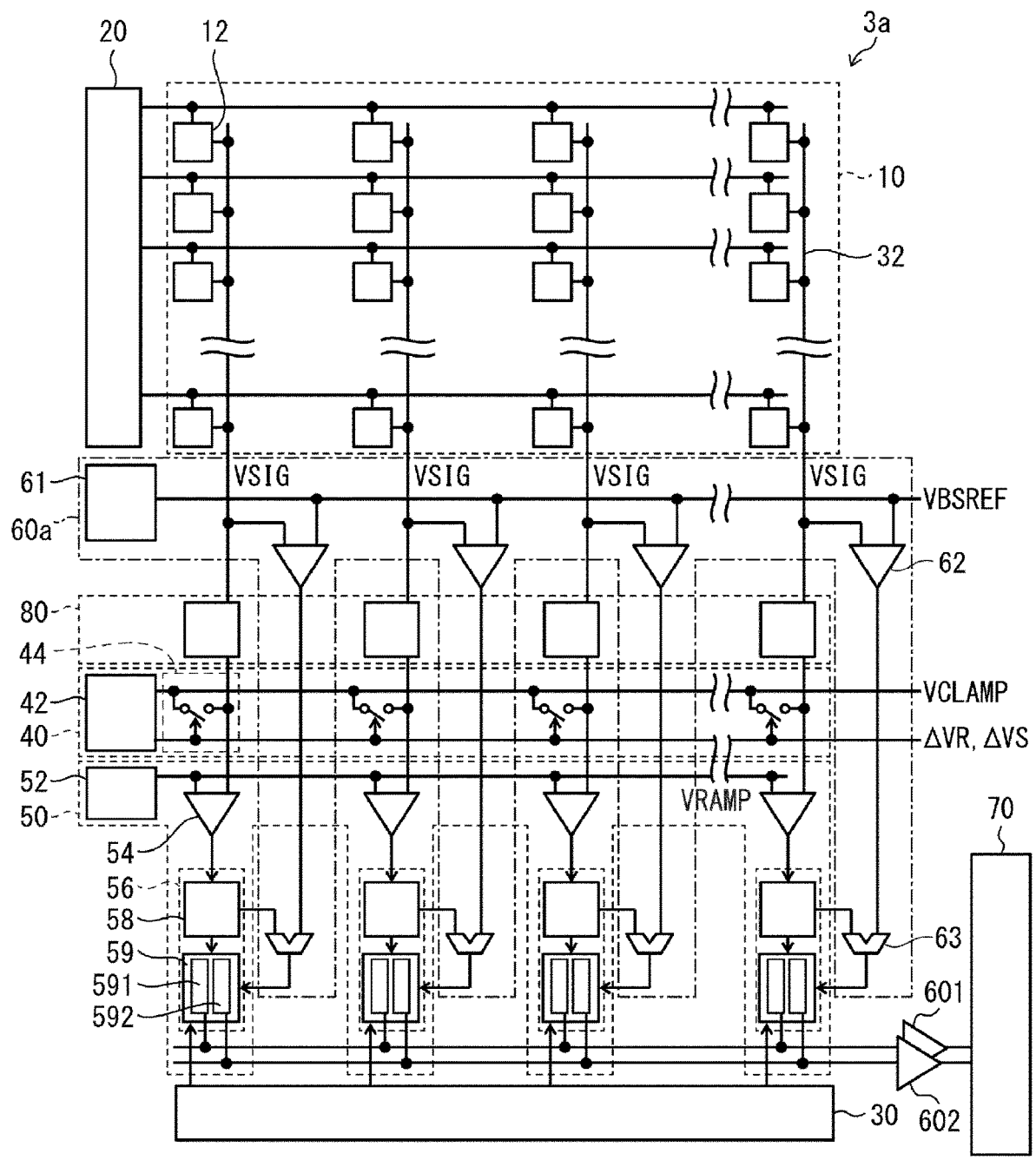
FIG. 14 is a circuit diagram illustrating a configuration example of a modification example of a solid-state image sensor according to the third embodiment of the present disclosure.

As a modification example of the solid-state image sensor 3, for example, as illustrated in FIG. 14, a solid-state image sensor 3*a* provided with the blackening phenomenon determination circuit 60*a* instead of the blackening phenomenon determination circuit 60 is assumed. A configuration of the solid-state image sensor 3*a* is the same as that of the solid-state image sensor 3 except for the blackening phenomenon determination circuit 60*a*. The blackening phenomenon determination circuit 60*a* of the solid-state image sensor 3*a* includes the reference potential generator 61, the first comparison circuit 62, the latch circuit 59, and the selector 63, and has the same configuration as that of the blackening phenomenon determination circuit 60*a* in the solid-state image sensor 1*a* according to the modification example of the first embodiment. Further, the selector 63 of the blackening phenomenon determination circuit 60*a* of the solid-state image sensor 3*a* has the same configuration and function as the selector 63 of the blackening phenomenon determination circuit 60*a* of the solid-state image sensor 1*a*.

Summary

A solid-state image sensor (1, 1*a*, 2, 3, 3*a*) according to first aspect of the present disclosure is configured to include a pixel unit (10) in which a plurality of unit pixels (12) for photoelectric conversion of incident light are arranged; an AD conversion circuit (50) that performs AD conversion on a potential (VSIG) of an analog signal read from a pixel signal line (32) connected to the plurality of the unit pixels; and a discrimination circuit (first comparison circuit 62) that discriminates whether or not a reset potential at the potential of the analog signal is equal to or higher than a predetermined first reference potential (VBSREF), in which the AD conversion circuit includes a counter circuit (58) that performs count processing and a first latch circuit (591) that holds at least a discrimination result among the discrimination result of the discrimination circuit and a first output result output from the counter circuit.

According to the above configuration, the discrimination circuit can discriminate whether or not the blackening phenomenon of the image occurs by discriminating whether or not the reset potential is higher than the predetermined first reference potential. In addition, the first latch circuit that holds the first output result of the counter circuit also holds the discrimination result of the discrimination circuit in some cases. Here, since the first latch circuit that holds the first output result of the counter circuit is a basic circuit that is included also in the solid-state image sensor in the related art, there is no need to separately provide a special latch circuit for holding the discrimination result of the discrimination circuit. Therefore, it is possible to avoid complicating the circuit configuration of the solid-state image sensor.

The above-described determination function of the blackening phenomenon of the image can be realized regardless of whether the AD conversion circuit of the solid-state image sensor adopts a digital CDS drive method or a hybrid CDS drive method. Therefore, it is possible to realize a solid-state image sensor capable of suppressing the blackening phenomenon of the image by both of the digital CDS drive method or the hybrid CDS drive method while reducing the circuit scale.

In the solid-state image sensor (1, 1a) according to a second aspect of the present disclosure, in the first aspect, the AD conversion circuit may further include a comparison circuit (second comparison circuit 54) that compares the potential of the analog signal with a second reference potential (VRAMP) which is a potential of a ramp waveform that changes with time, and performs AD conversion on the potential of the analog signal during a first count period and a second count period after the first count period, the counter circuit sets an initial value of first count processing performed during the first count period as a negative value, stops the first count processing with a change in an output signal output from the comparison circuit as a trigger, inverts all bits of a first count value when the first count processing is stopped before starting second count processing performed during the second count period, and uses a value obtained by inverting all the bits of the first count value as an initial value of the second count processing performed during the second count period, the first latch circuit holds a most significant bit of the first count value output from the counter circuit, and the AD conversion circuit may further include a second latch circuit (592) that holds all the bits of a second count value output from the counter circuit when the second count processing is stopped.

According to the above configuration, since the counter circuit sets the initial value of the first count processing to a negative value and inverts all bits of the first count value, the second count value does not obtain a negative value in a normal state. Therefore, it is not necessary to add a 1-bit counter circuit for coding to the counter circuit. Therefore, it is possible to realize a solid-state image sensor capable of further reducing power consumption while reducing the circuit scale.

Further, since the first count value takes a negative value when the reset potential is normal, the most significant bit held by the first latch circuit is always 1. On the other hand, when the reset potential is abnormal, the first count value becomes 0 or more, so that the most significant bit held by the first latch circuit is always 0. Therefore, it is possible to discriminate whether or not the abnormality such as light reception of the intense light has occurred based not only on the discrimination result of the discrimination circuit but also on the most significant bit of the first count value, and the determination accuracy of the solid-state image sensor 1 is improved.

Further, since the first latch circuit that holds the first output result of the counter circuit is a basic circuit that also includes the solid-state image sensor in the related art, there is no need to separately provide a special latch circuit or a detection period for detecting the presence or absence of the occurrence of the abnormality. Therefore, it is possible to avoid complicating the circuit configuration of the solid-state image sensor and reduce the power consumption of the solid-state image sensor. In addition, the difference between the reset potential and the signal potential can be acquired based on the second count value held in the second latch circuit.

The solid-state image sensor (1, 1a, 2, 3, 3a) according to a third aspect of the present disclosure, in the second aspect, further includes a post-stage processing logic circuit (70) to which the discrimination result and the first output result that are output from the first latch circuit and a second output result that is output from the second latch circuit are respectively input, and the post-stage processing logic circuit outputs any of the second output result output from the second latch circuit or a replacement result that is obtained by replacing the second output result with a full code in the post-stage processing logic circuit, in accordance with the discrimination result output from the first latch circuit.

According to the above configuration, the post-stage processing logic circuit can output the second output result output from the second latch circuit as it is in a case where the discrimination result indicating that it is a normal time is acquired from the first latch circuit. On the other hand, in a case where the discrimination result indicating that an abnormality has occurred is acquired from the first latch circuit, the post-stage processing logic circuit can replace the second output result output from the second latch circuit with a full code and output the result. Therefore, the blackening phenomenon of the image can be effectively suppressed.

In the solid-state image sensor according to a fourth aspect of the present disclosure, in the first aspect, the discrimination circuit may be a comparator circuit that compares the reset potential with the predetermined first reference potential. According to the above configuration, it is possible to determine whether or not the blackening phenomenon of the image occurs by comparing the reset potential with a predetermined first reference potential in the comparator circuit.

APPENDIX

The present disclosure is not limited to the above-described embodiments, and various modifications can be made within the scope of the claims, and the embodiments obtained by appropriately combining the technical means disclosed in the different embodiments are also included in the technical scope of the present disclosure. Furthermore, new technical features can be formed by combining the technical means disclosed in the embodiments.

The present disclosure contains subject matter related to that disclosed in U.S. Provisional Patent Application No.

63/003,558 filed in the U.S. Patent Office on Apr. 1, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensor comprising:
a pixel unit in which a plurality of unit pixels for photoelectric conversion of incident light are arranged;
an AD conversion circuit that performs AD conversion on a potential of an analog signal read from a pixel signal line connected to the plurality of unit pixels; and
a discrimination circuit that discriminates whether or not a reset potential at the potential of the analog signal is higher than a predetermined first reference potential,
wherein the AD conversion circuit includes
a counter circuit that performs count processing and
a first latch circuit that holds both a discrimination result of the discrimination circuit and a first output result output from the counter circuit.

2. A solid-state image sensor comprising:
a pixel unit in which a plurality of unit pixels for photoelectric conversion of incident light are arranged;
an AD conversion circuit that performs AD conversion on a potential of an analog signal read from a pixel signal line connected to the plurality of unit pixels; and
a discrimination circuit that discriminates whether or not a reset potential at the potential of the analog signal is higher than a predetermined first reference potential,
wherein the AD conversion circuit includes
a counter circuit that performs count processing,
a first latch circuit that holds at least a discrimination result of the discrimination circuit among the discrimination result of the discrimination circuit and a first output result output from the counter circuit, and
a comparison circuit that compares the potential of the analog signal with a second reference potential which is a potential of a ramp waveform that changes with time,
the AD conversion circuit performs AD conversion on the potential of the analog signal during a first count period and a second count period after the first count period, the counter circuit,
sets an initial value of first count processing performed during the first count period as a negative value,
stops the first count processing with a change in an output signal output from the comparison circuit as a trigger,
inverts all bits of a first count value when the first count processing is stopped before starting second count processing performed during the second count period, and
uses a value obtained by inverting all the bits of the first count value as an initial value of the second count processing performed during the second count period,
the first latch circuit holds a most significant bit of the first count value output from the counter circuit, and
the AD conversion circuit further includes a second latch circuit that holds all bits of a second count value output from the counter circuit when the second count processing is stopped.

3. The solid-state image sensor according to claim 2, further comprising:
a post-stage processing logic circuit to which the discrimination result and the first output result that are output from the first latch circuit and a second output result that is output from the second latch circuit are respectively input, wherein
the post-stage processing logic circuit outputs any of the second output result output from the second latch circuit or a replacement result that is obtained by replacing the second output result with a full code in the post-stage processing logic circuit, in accordance with the discrimination result output from the first latch circuit.

4. The solid-state image sensor according to claim 1, wherein the discrimination circuit is a comparator circuit that compares the reset potential with the predetermined first reference potential.

5. A solid-state image sensor comprising:
a pixel unit in which a plurality of unit pixels for photoelectric conversion of incident light are arranged;
an AD conversion circuit that performs AD conversion on (i) a potential corresponding to a difference between a signal potential and a reset potential at a potential of an analog signal read from a pixel signal line connected to the plurality of unit pixels and (ii) a predetermined reference potential; and
a discrimination circuit that discriminates whether or not the reset potential at the potential of the analog signal is higher than a predetermined first reference potential,
wherein the AD conversion circuit includes
a counter circuit that performs count processing and
a first latch circuit that holds a discrimination result of the discrimination circuit.

* * * * *